United States Patent
Sandhu et al.

(10) Patent No.: US 10,290,799 B2
(45) Date of Patent: *May 14, 2019

(54) MAGNETIC MEMORY CELLS AND SEMICONDUCTOR DEVICES

(71) Applicant: Micron Technology, Inc., Boise, ID (US)

(72) Inventors: Gurtej S. Sandhu, Boise, ID (US); Witold Kula, Gilroy, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/000,272

(22) Filed: Jun. 5, 2018

(65) Prior Publication Data

US 2018/0287053 A1 Oct. 4, 2018

Related U.S. Application Data

(60) Continuation of application No. 15/239,481, filed on Aug. 17, 2016, now Pat. No. 10,020,446, which is a
(Continued)

(51) Int. Cl.
*G11C 11/16* (2006.01)
*H01L 43/10* (2006.01)
(Continued)

(52) U.S. Cl.
CPC .......... *H01L 43/10* (2013.01); *G11C 11/161* (2013.01); *G11C 11/1673* (2013.01);
(Continued)

(58) Field of Classification Search
CPC ......... H01L 43/10; H01L 43/02; H01L 43/08; H01L 43/12; H01L 27/226; G11C 11/1675; G11C 11/1673; G11C 11/161
See application file for complete search history.

(56) References Cited

U.S. PATENT DOCUMENTS

| 4,882,936 A | 11/1989 | Garshelis |
| 5,551,586 A | 9/1996 | Uenoyama et al. |

(Continued)

FOREIGN PATENT DOCUMENTS

| CN | 101162756 A | 4/2008 |
| CN | 101395732 A | 3/2009 |

(Continued)

OTHER PUBLICATIONS

Ando et al., Electrically Tunable Spin Injector Free from the Impedance Mismatch Problem, Nature Materials, vol. 10 (Sep. 2011), pp. 655-659.
(Continued)

*Primary Examiner* — Joseph C. Nicely
*Assistant Examiner* — Pavel G Ivanov
(74) *Attorney, Agent, or Firm* — TraskBritt

(57) ABSTRACT

A magnetic cell includes a free region between an intermediate oxide region (e.g., a tunnel barrier) and a secondary oxide region. Both oxide regions may be configured to induce magnetic anisotropy ("MA") with the free region, enhancing the MA strength of the free region. A getter material proximate to the secondary oxide region is formulated and configured to remove oxygen from the secondary oxide region, reducing an oxygen concentration and an electrical resistance of the secondary oxide region. Thus, the secondary oxide region contributes only minimally to the electrical resistance of the cell core. Embodiments of the present disclosure therefore enable a high effective magnetoresistance, low resistance area product, and low programming voltage along with the enhanced MA strength. Methods of fabrication, memory arrays, memory systems, and electronic systems are also disclosed.

19 Claims, 5 Drawing Sheets

Related U.S. Application Data division of application No. 14/026,627, filed on Sep. 13, 2013, now Pat. No. 9,461,242.

(51) Int. Cl.
*H01L 43/12* (2006.01)
*H01L 43/08* (2006.01)
*H01L 43/02* (2006.01)
*H01L 27/22* (2006.01)

(52) U.S. Cl.
CPC .......... *G11C 11/1675* (2013.01); *H01L 43/02* (2013.01); *H01L 43/08* (2013.01); *H01L 43/12* (2013.01); *H01L 27/226* (2013.01)

(56) References Cited

U.S. PATENT DOCUMENTS

| | | |
|---|---|---|
| 5,563,000 A | 10/1996 | Tukaram et al. |
| 5,565,266 A | 10/1996 | Hatwar et al. |
| 5,583,725 A | 12/1996 | Coffey et al. |
| 5,604,030 A | 2/1997 | Yamane et al. |
| 5,768,069 A | 6/1998 | Mauri |
| 6,166,948 A | 12/2000 | Parkin et al. |
| 6,258,470 B1 | 7/2001 | Sakakima et al. |
| 6,275,363 B1 | 8/2001 | Gill |
| 6,347,049 B1 | 2/2002 | Childress et al. |
| 6,363,000 B2 | 3/2002 | Perner et al. |
| 6,387,476 B1 | 5/2002 | Iwasaki et al. |
| 6,483,741 B1 | 11/2002 | Iwasaki et al. |
| 6,560,135 B2 | 5/2003 | Matsuoka et al. |
| 6,569,545 B1 | 5/2003 | Tetsuya et al. |
| 6,611,405 B1 | 8/2003 | Inomata et al. |
| 6,653,704 B1 | 11/2003 | Gurney et al. |
| 6,703,249 B2 | 3/2004 | Okazawa et al. |
| 6,771,534 B2 | 8/2004 | Stipe |
| 6,806,096 B1 | 10/2004 | Kim et al. |
| 6,845,038 B1 | 1/2005 | Shukh |
| 6,955,857 B2 | 10/2005 | Kubota et al. |
| 6,964,819 B1 | 11/2005 | Girt et al. |
| 6,970,376 B1 | 11/2005 | Fukuzumi |
| 6,980,468 B1 | 12/2005 | Ounadjela |
| 6,992,359 B2 | 1/2006 | Nguyen et al. |
| 6,998,150 B2 | 2/2006 | Li et al. |
| 7,026,671 B2 | 4/2006 | Mizuguchi et al. |
| 7,095,933 B2 | 8/2006 | Barth |
| 7,130,167 B2 | 10/2006 | Gill |
| 7,189,583 B2 | 3/2007 | Drewes |
| 7,230,265 B2 | 6/2007 | Kaiser et al. |
| 7,239,489 B2 | 7/2007 | Lin et al. |
| 7,274,080 B1 | 9/2007 | Parkin |
| 7,372,674 B2 | 5/2008 | Gill |
| 7,378,698 B2 | 5/2008 | Ha et al. |
| 7,379,280 B2 | 5/2008 | Fukumoto et al. |
| 7,486,552 B2 | 2/2009 | Apalkov et al. |
| 7,488,609 B1 | 2/2009 | Lin et al. |
| 7,514,160 B2 | 4/2009 | Nagahama et al. |
| 7,563,486 B2 | 7/2009 | Barth |
| 7,564,152 B1 | 7/2009 | Clark et al. |
| 7,602,033 B2 | 10/2009 | Zhao et al. |
| 7,660,153 B2 | 2/2010 | Yamane et al. |
| 7,682,841 B2 | 3/2010 | Dahmani et al. |
| 7,732,881 B2 | 6/2010 | Wang |
| 7,750,421 B2 | 7/2010 | Horng et al. |
| 7,791,844 B2 | 9/2010 | Carey et al. |
| 7,835,173 B2 | 11/2010 | Ma et al. |
| 7,863,060 B2 | 1/2011 | Belen et al. |
| 7,885,105 B2 | 2/2011 | Li et al. |
| 7,919,794 B2 | 4/2011 | Gu et al. |
| 7,929,370 B2 | 4/2011 | Min |
| 7,932,572 B2 | 4/2011 | Tsujiuchi |
| 7,948,044 B2 | 5/2011 | Horng et al. |
| 8,009,465 B2 | 8/2011 | Nakayama et al. |
| 8,043,732 B2 | 10/2011 | Anderson et al. |
| 8,048,492 B2 | 11/2011 | Fukuzawa et al. |
| 8,068,317 B2 | 11/2011 | Gill |
| 8,080,432 B2 | 12/2011 | Horng et al. |
| 8,089,137 B2 | 1/2012 | Lung et al. |
| 8,102,700 B2 | 1/2012 | Liu et al. |
| 8,120,949 B2 | 2/2012 | Ranjan et al. |
| 8,138,561 B2 | 3/2012 | Horng et al. |
| 8,223,539 B2 | 7/2012 | Smythe et al. |
| 8,324,697 B2 | 12/2012 | Worledge |
| 8,334,148 B2 | 12/2012 | Jeong et al. |
| 8,338,004 B2 | 12/2012 | Shin et al. |
| 8,357,962 B2 | 1/2013 | Marukame et al. |
| 8,385,107 B2 | 2/2013 | Prejbeanu |
| 8,411,498 B2 | 4/2013 | Kim et al. |
| 8,422,286 B2 | 4/2013 | Ranjan et al. |
| 8,470,462 B2 | 6/2013 | Horng et al. |
| 8,487,390 B2 | 7/2013 | Dimitrov et al. |
| 8,492,169 B2 | 7/2013 | Cao et al. |
| 8,514,527 B2 | 8/2013 | Komagaki et al. |
| 8,545,999 B1 | 10/2013 | Leng et al. |
| 8,570,798 B2 | 10/2013 | Meade et al. |
| 8,587,043 B2 | 11/2013 | Natori et al. |
| 8,604,573 B2 | 12/2013 | Yamakawa et al. |
| 8,623,452 B2 | 1/2014 | Zhou |
| 8,692,342 B2 | 4/2014 | Oh et al. |
| 8,704,320 B2 | 4/2014 | Zhu et al. |
| 8,749,003 B2 | 6/2014 | Horng et al. |
| 8,766,341 B2 | 7/2014 | Han et al. |
| 8,779,538 B2 | 7/2014 | Chen et al. |
| 8,803,265 B2 | 8/2014 | Lim et al. |
| 8,812,803 B2 | 8/2014 | Tsuchiya et al. |
| 8,823,118 B2 | 9/2014 | Horng et al. |
| 9,373,780 B2 | 6/2016 | Jan et al. |
| 9,466,789 B2 | 10/2016 | Wang et al. |
| 9,472,752 B2 | 10/2016 | Wang et al. |
| 9,659,592 B2 | 5/2017 | Ataka et al. |
| 9,705,075 B2 | 7/2017 | Lim et al. |
| 2001/0024853 A1 | 9/2001 | Wallace et al. |
| 2002/0089874 A1 | 7/2002 | Nickel et al. |
| 2002/0097534 A1 | 7/2002 | Sun et al. |
| 2002/0105827 A1 | 8/2002 | Redon et al. |
| 2002/0114112 A1 | 8/2002 | Nakashio et al. |
| 2003/0011939 A1 | 1/2003 | Gill |
| 2003/0030434 A1 | 2/2003 | Hasegawa et al. |
| 2003/0035255 A1 | 2/2003 | Hasegawa et al. |
| 2003/0063415 A1 | 4/2003 | Hasegawa et al. |
| 2003/0064569 A1 | 4/2003 | Takayama et al. |
| 2003/0103371 A1 | 6/2003 | Kim et al. |
| 2003/0142562 A1 | 7/2003 | Kreupl |
| 2003/0199104 A1 | 10/2003 | Leuschner et al. |
| 2004/0008455 A1 | 1/2004 | Hasegawa et al. |
| 2004/0075959 A1 | 4/2004 | Gill |
| 2004/0091744 A1 | 5/2004 | Carey et al. |
| 2004/0144995 A1 | 7/2004 | Nagahama et al. |
| 2004/0174740 A1 | 9/2004 | Lee et al. |
| 2004/0224243 A1 | 11/2004 | Yoshizawa et al. |
| 2004/0233760 A1 | 11/2004 | Guo et al. |
| 2004/0246776 A1 | 12/2004 | Covington |
| 2005/0019608 A1 | 1/2005 | Kim et al. |
| 2005/0024786 A1 | 2/2005 | Gill et al. |
| 2005/0036361 A1 | 2/2005 | Fukuzumi |
| 2005/0068683 A1 | 3/2005 | Gill |
| 2005/0087511 A1 | 4/2005 | Sharma et al. |
| 2005/0106810 A1 | 5/2005 | Pakala et al. |
| 2005/0164414 A1 | 7/2005 | Deak |
| 2005/0173698 A1 | 8/2005 | Drewes |
| 2005/0189574 A1 | 9/2005 | Nguyen et al. |
| 2005/0211973 A1 | 9/2005 | Mori et al. |
| 2005/0230743 A1 | 10/2005 | Nakagawa et al. |
| 2005/0231853 A1 | 10/2005 | Li et al. |
| 2005/0233174 A1 | 10/2005 | Munteanu et al. |
| 2005/0276099 A1 | 12/2005 | Horng et al. |
| 2006/0002039 A1 | 1/2006 | Hasegawa et al. |
| 2006/0038213 A1 | 2/2006 | Mori et al. |
| 2006/0042930 A1 | 3/2006 | Mauri |
| 2006/0098354 A1 | 5/2006 | Parkin |
| 2006/0114714 A1 | 6/2006 | Kanegae |
| 2006/0118842 A1 | 6/2006 | Iwata |
| 2006/0261425 A1 | 11/2006 | Suemitsu et al. |
| 2007/0008661 A1 | 1/2007 | Min et al. |
| 2007/0026260 A1 | 2/2007 | Nemoto et al. |

(56) References Cited

U.S. PATENT DOCUMENTS

| | | |
|---|---|---|
| 2007/0026263 A1 | 2/2007 | Kubota et al. |
| 2007/0035890 A1 | 2/2007 | Sbiaa |
| 2007/0053112 A1 | 3/2007 | Papworth Parkin |
| 2007/0086121 A1 | 4/2007 | Nagase et al. |
| 2007/0132003 A1 | 6/2007 | Takashima et al. |
| 2007/0201265 A1 | 8/2007 | Ranjan et al. |
| 2007/0217071 A1 | 9/2007 | Inamura et al. |
| 2007/0247756 A1 | 10/2007 | Lai et al. |
| 2007/0253116 A1 | 11/2007 | Takahashi |
| 2007/0279977 A1 | 12/2007 | Banerjee et al. |
| 2007/0297220 A1 | 12/2007 | Yoshikawa et al. |
| 2008/0164502 A1 | 7/2008 | Fukumoto et al. |
| 2008/0164548 A1 | 7/2008 | Ranjan et al. |
| 2008/0170329 A1 | 7/2008 | Thangaraj et al. |
| 2008/0179699 A1 | 7/2008 | Horng et al. |
| 2008/0182131 A1 | 7/2008 | Iwasaki |
| 2008/0198512 A1 | 8/2008 | Mukai |
| 2008/0205130 A1 | 8/2008 | Sun et al. |
| 2008/0225581 A1 | 9/2008 | Yamane et al. |
| 2008/0242088 A1 | 10/2008 | Suzuki |
| 2008/0253039 A1 | 10/2008 | Nagamine et al. |
| 2008/0278867 A1 | 11/2008 | Fukumoto et al. |
| 2009/0039450 A1 | 2/2009 | Lee et al. |
| 2009/0079018 A1 | 3/2009 | Nagase et al. |
| 2009/0096043 A1 | 4/2009 | Min et al. |
| 2009/0108383 A1 | 4/2009 | Horng et al. |
| 2009/0168238 A1 | 7/2009 | Kim et al. |
| 2009/0180215 A1 | 7/2009 | Ishikawa et al. |
| 2009/0190262 A1 | 7/2009 | Murakami et al. |
| 2009/0195924 A1 | 8/2009 | Nemoto et al. |
| 2009/0218645 A1 | 9/2009 | Ranjan et al. |
| 2009/0229111 A1 | 9/2009 | Zhao et al. |
| 2009/0231909 A1 | 9/2009 | Dieny et al. |
| 2009/0250776 A1 | 10/2009 | Takenaga et al. |
| 2009/0251829 A1 | 10/2009 | Zhang et al. |
| 2009/0257151 A1 | 10/2009 | Zhang et al. |
| 2010/0034014 A1 | 2/2010 | Ohno et al. |
| 2010/0035085 A1 | 2/2010 | Jung et al. |
| 2010/0080036 A1 | 4/2010 | Liu et al. |
| 2010/0080048 A1 | 4/2010 | Liu et al. |
| 2010/0086809 A1 | 4/2010 | Kuboki |
| 2010/0096716 A1 | 4/2010 | Ranjan et al. |
| 2010/0102406 A1 | 4/2010 | Xi et al. |
| 2010/0109110 A1 | 5/2010 | Wang et al. |
| 2010/0110783 A1 | 5/2010 | Liu et al. |
| 2010/0140726 A1 | 6/2010 | Apalkov et al. |
| 2010/0148167 A1 | 6/2010 | Whig et al. |
| 2010/0171086 A1 | 7/2010 | Lung et al. |
| 2010/0176472 A1 | 7/2010 | Shoji |
| 2010/0177557 A1 | 7/2010 | Liu et al. |
| 2010/0177561 A1 | 7/2010 | Liu et al. |
| 2010/0200899 A1 | 8/2010 | Marukame et al. |
| 2010/0219491 A1 | 9/2010 | Lee et al. |
| 2010/0220516 A1 | 9/2010 | Lee et al. |
| 2010/0230769 A1 | 9/2010 | Ozaki et al. |
| 2010/0240151 A1 | 9/2010 | Belen et al. |
| 2010/0276771 A1 | 11/2010 | Fukumoto et al. |
| 2010/0327248 A1 | 12/2010 | Khoueir et al. |
| 2010/0328822 A1 | 12/2010 | Park et al. |
| 2011/0007429 A1 | 1/2011 | Dimitrov et al. |
| 2011/0007543 A1 | 1/2011 | Khoury |
| 2011/0014500 A1 | 1/2011 | Horng et al. |
| 2011/0031569 A1 | 2/2011 | Watts et al. |
| 2011/0049657 A1 | 3/2011 | Tsukamoto et al. |
| 2011/0049658 A1 | 3/2011 | Zheng et al. |
| 2011/0051503 A1 | 3/2011 | Hu et al. |
| 2011/0062537 A1 | 3/2011 | Oh et al. |
| 2011/0064969 A1 | 3/2011 | Chen et al. |
| 2011/0086439 A1 | 4/2011 | Choi |
| 2011/0096443 A1 | 4/2011 | Zhang et al. |
| 2011/0121366 A1 | 5/2011 | Or-Bach et al. |
| 2011/0145514 A1 | 6/2011 | Lee et al. |
| 2011/0149646 A1 | 6/2011 | Liu et al. |
| 2011/0149647 A1 | 6/2011 | Kim et al. |
| 2011/0149670 A1 | 6/2011 | Heo et al. |
| 2011/0151280 A1 | 6/2011 | Takahashi et al. |
| 2011/0170339 A1 | 7/2011 | Wunderlich et al. |
| 2011/0170341 A1 | 7/2011 | Butler |
| 2011/0194329 A1 | 8/2011 | Ohba et al. |
| 2011/0241138 A1 | 10/2011 | Hsieh et al. |
| 2011/0260274 A1 | 10/2011 | Zheng et al. |
| 2011/0266642 A1 | 11/2011 | Viala et al. |
| 2011/0269251 A1 | 11/2011 | Kim et al. |
| 2011/0293967 A1 | 12/2011 | Zhang et al. |
| 2011/0298456 A1 | 12/2011 | Lu et al. |
| 2011/0303995 A1 | 12/2011 | Worledge |
| 2011/0303997 A1 | 12/2011 | Wang et al. |
| 2011/0309418 A1 | 12/2011 | Nakayama et al. |
| 2012/0012952 A1 | 1/2012 | Chen et al. |
| 2012/0012953 A1 | 1/2012 | Lottis et al. |
| 2012/0012954 A1 | 1/2012 | Yamada et al. |
| 2012/0015099 A1 | 1/2012 | Sun et al. |
| 2012/0018823 A1 | 1/2012 | Huai et al. |
| 2012/0018825 A1 | 1/2012 | Lim et al. |
| 2012/0023386 A1 | 1/2012 | Oh et al. |
| 2012/0040207 A1 | 2/2012 | Horng et al. |
| 2012/0061781 A1 | 3/2012 | Ohmori et al. |
| 2012/0068139 A1 | 3/2012 | Daibou et al. |
| 2012/0069647 A1 | 3/2012 | Kramer et al. |
| 2012/0074511 A1 | 3/2012 | Takahashi et al. |
| 2012/0075922 A1 | 3/2012 | Yamada et al. |
| 2012/0075927 A1 | 3/2012 | Chen et al. |
| 2012/0106233 A1 | 5/2012 | Katti |
| 2012/0112297 A1 | 5/2012 | Yamakawa et al. |
| 2012/0134201 A1 | 5/2012 | Ogimoto |
| 2012/0135273 A1 | 5/2012 | Horng et al. |
| 2012/0146167 A1 | 6/2012 | Huai et al. |
| 2012/0155156 A1 | 6/2012 | Watts et al. |
| 2012/0164485 A1 | 6/2012 | Lin |
| 2012/0181537 A1 | 7/2012 | Cao et al. |
| 2012/0182796 A1 | 7/2012 | Uchida et al. |
| 2012/0205758 A1 | 8/2012 | Jan et al. |
| 2012/0217594 A1 | 8/2012 | Kajiyama |
| 2012/0217599 A1 | 8/2012 | Nam et al. |
| 2012/0218813 A1 | 8/2012 | Oh et al. |
| 2012/0225499 A1 | 9/2012 | Nozieres et al. |
| 2012/0236631 A1 | 9/2012 | Park et al. |
| 2012/0241878 A1 | 9/2012 | Hu et al. |
| 2012/0241879 A1 | 9/2012 | Ikeno et al. |
| 2012/0261777 A1 | 10/2012 | Shukh |
| 2012/0267733 A1 | 10/2012 | Hu et al. |
| 2012/0280336 A1 | 11/2012 | Jan et al. |
| 2012/0286382 A1 | 11/2012 | Jan et al. |
| 2012/0299134 A1 | 11/2012 | Jan et al. |
| 2012/0299137 A1 | 11/2012 | Worledge |
| 2012/0300542 A1 | 11/2012 | Uchida et al. |
| 2013/0005052 A1 | 1/2013 | Hu et al. |
| 2013/0015539 A1 | 1/2013 | Choi |
| 2013/0028013 A1 | 1/2013 | Ikeda et al. |
| 2013/0032911 A1 | 2/2013 | Jung et al. |
| 2013/0042081 A1 | 2/2013 | Park et al. |
| 2013/0043471 A1 | 2/2013 | Cao et al. |
| 2013/0059168 A1 | 3/2013 | Tahmasebi et al. |
| 2013/0064011 A1 | 3/2013 | Liu et al. |
| 2013/0069185 A1 | 3/2013 | Saida et al. |
| 2013/0075839 A1 | 3/2013 | Chen et al. |
| 2013/0134534 A1 | 5/2013 | Sbiaa et al. |
| 2013/0140658 A1 | 6/2013 | Yamane et al. |
| 2013/0146996 A1 | 6/2013 | Yu et al. |
| 2013/0148418 A1 | 6/2013 | Luo et al. |
| 2013/0177781 A1 | 7/2013 | Chepulskyy et al. |
| 2013/0209836 A1 | 8/2013 | Ataka et al. |
| 2013/0221459 A1 | 8/2013 | Jan et al. |
| 2013/0221460 A1 | 8/2013 | Jan et al. |
| 2013/0224521 A1 | 8/2013 | Wang et al. |
| 2013/0228884 A1 | 9/2013 | Zheng et al. |
| 2013/0229866 A1 | 9/2013 | Ranjan et al. |
| 2013/0236639 A1 | 9/2013 | Carey et al. |
| 2013/0242435 A1 | 9/2013 | Fuji et al. |
| 2013/0250661 A1 | 9/2013 | Sandhu et al. |
| 2013/0288392 A1 | 10/2013 | Nozieres et al. |
| 2013/0288398 A1 | 10/2013 | Yamamoto et al. |
| 2013/0313665 A1 | 11/2013 | Rhie et al. |
| 2013/0314815 A1 | 11/2013 | Yuan et al. |

(56) References Cited

U.S. PATENT DOCUMENTS

| | | |
|---|---|---|
| 2013/0334630 A1 | 12/2013 | Kula et al. |
| 2013/0334631 A1 | 12/2013 | Kinney et al. |
| 2014/0008742 A1 | 1/2014 | Chen et al. |
| 2014/0015076 A1 | 1/2014 | Gan et al. |
| 2014/0021426 A1 | 1/2014 | Lee et al. |
| 2014/0027869 A1 | 1/2014 | Lee et al. |
| 2014/0038312 A1 | 2/2014 | Lee et al. |
| 2014/0063656 A1 | 3/2014 | Hashimoto |
| 2014/0064047 A1 | 3/2014 | Niwa et al. |
| 2014/0070341 A1 | 3/2014 | Beach et al. |
| 2014/0084398 A1 | 3/2014 | Oguz et al. |
| 2014/0099735 A1 | 4/2014 | Horng et al. |
| 2014/0116984 A1 | 5/2014 | Ding et al. |
| 2014/0151843 A1 | 6/2014 | Millward et al. |
| 2014/0157065 A1 | 6/2014 | Ong |
| 2014/0217526 A1 | 8/2014 | Guo |
| 2014/0242419 A1 | 8/2014 | Singh et al. |
| 2014/0264663 A1 | 9/2014 | Chen et al. |
| 2014/0268301 A1 | 9/2014 | Ding et al. |
| 2014/0269064 A1 | 9/2014 | Jeon et al. |
| 2014/0272454 A1 | 9/2014 | Zhang et al. |
| 2014/0287537 A1 | 9/2014 | Shukh |
| 2014/0293436 A1 | 10/2014 | Nagahama et al. |
| 2014/0308542 A1 | 10/2014 | Zhang et al. |
| 2014/0327095 A1 | 11/2014 | Kim et al. |
| 2014/0334032 A1 | 11/2014 | Nishioka et al. |
| 2014/0339504 A1 | 11/2014 | Kim et al. |
| 2014/0367814 A1 | 12/2014 | Ohmori et al. |
| 2015/0028439 A1 | 1/2015 | Kula et al. |
| 2015/0041933 A1 | 2/2015 | Chepulskyy et al. |
| 2015/0069556 A1 | 3/2015 | Yamakawa et al. |
| 2015/0076485 A1 | 3/2015 | Sandhu et al. |
| 2015/0076633 A1 | 3/2015 | Siddik et al. |
| 2015/0179916 A1 | 6/2015 | Pramanik et al. |
| 2015/0249202 A1 | 9/2015 | Siddik et al. |
| 2015/0270478 A1 | 9/2015 | Annunziata et al. |
| 2015/0287910 A1 | 10/2015 | Lu et al. |
| 2015/0295164 A1 | 10/2015 | Sandhu et al. |
| 2015/0303372 A1 | 10/2015 | Meade et al. |
| 2015/0340601 A1 | 11/2015 | Huai et al. |
| 2016/0005954 A1 | 1/2016 | Erickson et al. |
| 2016/0086645 A1 | 3/2016 | Erickson et al. |
| 2016/0111632 A1 | 4/2016 | Sandhu et al. |
| 2016/0155932 A1 | 6/2016 | Chen et al. |
| 2016/0211440 A1 | 7/2016 | Siddik et al. |
| 2016/0359105 A1 | 12/2016 | Sandhu et al. |

FOREIGN PATENT DOCUMENTS

| | | |
|---|---|---|
| CN | 101461064 A | 6/2009 |
| CN | 102246327 A | 11/2011 |
| CN | 102610270 A | 7/2012 |
| CN | 102800803 A | 11/2012 |
| CN | 103022342 A | 4/2013 |
| CN | 104241286 A | 12/2014 |
| EP | 1353443 A2 | 10/2003 |
| EP | 1885006 A1 | 2/2008 |
| EP | 2385548 A1 | 11/2011 |
| EP | 2541554 A1 | 1/2013 |
| EP | 2015307 B1 | 10/2013 |
| GB | 2343308 A | 5/2000 |
| JP | 2002314049 A | 10/2002 |
| JP | 2004104076 A | 4/2004 |
| JP | 2004179668 A | 6/2004 |
| JP | 2006165059 A | 6/2006 |
| JP | 2007173843 A | 7/2007 |
| JP | 2008010590 A | 1/2008 |
| JP | 2008192926 A | 8/2008 |
| JP | 2008198792 A | 8/2008 |
| JP | 2008270835 A | 11/2008 |
| JP | 2009194366 A | 8/2009 |
| JP | 2010087355 A | 4/2010 |
| JP | 2010093157 A | 4/2010 |
| JP | 2011119755 A | 6/2011 |
| JP | 2011521391 A | 7/2011 |
| JP | 2012064624 A | 3/2012 |
| JP | 2012-099816 A | 5/2012 |
| JP | 2012142480 A | 7/2012 |
| JP | 2012518910 A | 8/2012 |
| JP | 2012204432 A | 10/2012 |
| JP | 2012244031 A | 12/2012 |
| JP | 2013145846 A | 7/2013 |
| JP | 2014-003313 A | 1/2014 |
| KR | 1020040092342 A | 11/2004 |
| KR | 1020070094431 A | 9/2007 |
| KR | 1020080029852 A | 4/2008 |
| KR | 1020120008295 | 1/2012 |
| WO | 2010026831 A1 | 11/2010 |
| WO | 2010134378 A1 | 11/2010 |
| WO | 2010137679 A1 | 12/2010 |
| WO | 2011001746 A1 | 1/2011 |
| WO | 2011149274 A2 | 12/2011 |
| WO | 2011159422 A1 | 12/2011 |
| WO | 2012086183 A | 6/2012 |
| WO | 2012128891 A1 | 9/2012 |
| WO | 2012160937 A1 | 11/2012 |
| WO | 2013176332 A1 | 11/2013 |
| WO | 2013191920 A1 | 12/2013 |
| WO | 2014097520 A1 | 6/2014 |

OTHER PUBLICATIONS

Apalkov et al., Comparison of Scaling of In-Plane and Perpendicular Spin Transfer Switching Technologies by Micromagnetic Simulation, IEEE Transactions on Magnetics, vol. 46, Issue 6, (Jun. 2010), pp. 2240-2243 (abstract only).

Auwarter et al., Co on h-Bn/Ni(1 1 1): From Island to Island-Chain Formation and Co Intercalation, Surface Science, vol. 511, (2002), pp. 379-386.

Bai et al., Boron Diffusion Induced Symmetry Reduction and Scattering in CoFeB/MgO/CoFeB Magnetic Tunnel Junctions, Phys. Rev. B, vol. 87, (Jan. 23, 2013), pp. 014114 (abstract only).

Braun et al., Strain-Induced Perpendicular Magnetic Anisotropy in Ultrathin Ni Films on Cu3Au(0 0 1), Journal of Magnetism and Magnetic Materials, vol. 171, (1997), pp. 16-28.

Butler et al., "Spin-Dependent Tunneling Conductance of Fe|MgO|Fe Sandwiches," Physical Review B, vol. 63, (Jan. 8, 2001), 054416-1-054416-12.

Carrey et al., Influence of Interface Alloying on the Magnetic Properties of Co/Pd Multilayers, Applied Physics Letters, vol. 83, No. 25, (Dec. 22, 2003), pp. 5259-5261.

Cha et al., Atomic-Scale Spectroscopic Imaging of CoFeB/Mg—B—O/CoFeB Magnetic Tunnel Junctions, Applied Physics Letters, vol. 95, (2009), pp. 032506-1-032506-3.

Chen et al., Advances and Future Prospects of Spin-Transfer Torque Random Access Memory, IEEE Transactions on Magnetics, vol. 46, No. 6, (Jun. 2010), pp. 1873-1878.

Chinese Office Action (dated May 24, 2017) and Search Report (dated May 16, 2017) for Chinese Application No. 201480050473.0, 13 pages, including English translation.

Chinese Office Action and Search Report for Chinese Application No. 201480050473.0, dated Jan. 17, 2018, 14 pages including English translation.

Diao et al., Spin Transfer Switching in Dual MgO Magnetic Tunnel Junctions, Applied Physics Letters, vol. 90, (2007), pp. 132508-1-132508-3.

Djayaprawira et al., 230% Room-Temperature Magnetoresistance in CoFeB/MgO/CoFeB Magnetic Tunnel Junctions, Applied Physics Letters, vol. 86, Issue 9, (2005), 2 pages (abstract only).

European Examination Report from European Application No. 14844707.1, dated Jan. 8, 2018, 4 pages.

Extended European Search Report from European Application No. 14844707.1, dated May 4, 2017, 7 pages.

Farle et al., The Temperature Dependence of Magnetic Anisotropy in Ultra-Thin Films, Journal of Magnetism and Magnetic Materials, vol. 165, (1997), pp. 74-77.

Gan et al., Origin of the Collapse of Tunnel Magnetoresistance at High Annealing Temperature in CoFeB/MgO Perpendicular Magnetic Tunnel Junctions, Applied Physics Letters, vol. 99, (2011), pp. 252507-1-252507-3.

(56) References Cited

OTHER PUBLICATIONS

Gao et al., Combinatorial Exploration of Rare-Earth-Free Permanent Magnets: Magnetic and Microstructural Properties of Fe—Co—W Thin Films, Applied Physics Letters, vol. 102, (2013), pp. 022419-1-022419-4.
Greenwood et al., Chemistry of Elements, Second Edition, (1997), pp. 23-25.
Hayakawa et al., Dependence of Giant Tunnel Magnetoresistance of Sputtered CoFeB/MgO/CoFeB Magnetic Tunnel Junctions on MgO Barrier Thickness and Annealing Temperature, Japanese Journal of Applied Physics, vol. 14, No. 19, (2005), pp. L587-L589.
Heczko et al., Strain and Concurrent Magnetization Changes in Magnetic Shape Memory Ni—Mn—Ga Single crystals—Experiment and Model, Materials Science and Engineering A, vol. 481-482, (2008), pp. 283-287.
Hendrych et al., Magnetic Behavior and Domain Structure in As-Quenched, Annealed, and Stress-Annealed CoFeCrSiB Ribbons, Journal of Magnetism and Magnetic Materials, vol. 321, (2009), pp. 3771-3777.
Hindmarch et al., Zirconium as a Boron Sink in Crystalline CoFeB/MgO/CoFeB Magnetic Tunnel Junctions, the Japan Society of Applied Physics, 2011, pp. 1-3.
Ikeda et al., Tunnel Magnetoresistance of 604% at 300 K by Suppression of Ta Diffusion in CoFeB/MgO/CoFeB Pseudo-Spin-Valves Annealed at High Temperature, Applied Physics Letters, vol. 93, (2008), pp. 082508-1-082508-3.
International Search Report for International Application No. PCT/US2014/053827, (dated Dec. 16, 2014), 3 pages.
International Written Opinion for International Application No. PCT/US2014/053827, (dated Dec. 16, 2014), 8 pages.
Japanese Office Action from Japanese Application No. 2016-542009, dated Aug. 29, 2017, 6 pages with English Translation.
Japanese Office Action from Japanese Application No. 2016-542009, dated Mar. 28, 2017, 7 pages.
Kaufman, Myron, "Principles of Thermodynamics," Taylor & Francis Group LLC, (2002), Chap. 7: Chemical Reactions, 9 pages.
Ke et al., Oxygen-Vacancy-Induced Diffusive Scattering in Fe/MgO/Fe Magnetic Tunnel Junctions, Physical Review Letters, vol. 105, (Nov. 30, 2010), pp. 236801-1-236801-4.
Kim et al., Effect of Annealing on Magnetic Exchange Coupling in CoPt/Co Bilayer Thin Films, Journal of Applied Physics, vol. 87, No. 9, (May 1, 2000), pp. 6140-6142.
Kim et al., Enhancement of Data Retention and Write Current Scaling for Sub-20nm STT-MRAM by Utilizing Dual Interfaces for Perpendicular Magnetic Anisotropy, VLSI Technology (VLSIT), 2012 Symposium, (Jun. 12-14, 2012), 1 page (abstract only).
Knovel Sampler, Knovel, (2003), http://app.knovel.com/web/view/html/show.v/rcid:kpKS000009/cid:kt003BCMZ2/viewerType:html/root_slug:front-matter/url_slug:front-matter?b-q=ioniz; 2 pages.
Ko et al., Effects of MgO and MgO/Pd Seed-Layers on Perpendicular Magnetic Anisotropy of CoPd Thin Films, Thin Solid Films, vol. 519, (2011), pp. 8252-8255.
Kohda et al., Width and Temperature Dependence of Lithography-Induced Magnetic Anisotropy in (Ga,Mn)As Wires, Physica E, vol. 42, (2010), pp. 2685-2689.
Notice of Final Rejection from Korean Application No. 10-2016-7008983, dated Nov. 30, 2017, 7 pages with English translation.
Korean Notice of Preliminary Rejection from Korean Application No. 10-2016-7008983, dated May 19, 2017, 11 pages with English translation.
Korean Written Opinion from Korean Application No. 10-2016-7008983, dated Jul. 19, 2017, 7 pages with English translation.
Kurt et al., Giant tunneling magnetoresistance with electron beam evaporated MgO barrier and CoFeB electrodes, Journal of Applied Physics, Apr. 2010, vol. 107, pp. 1-6.
Lavrijsen et al., Tuning the Interlayer Exchange Coupling Between Single Perpendicularly Magnetized CoFeB Layers, Appl. Phys. Lett., vol. 100, (2012), pp. 052411-1-052411-5.
Lee et al., Improved Magnetic Tunnel Junction With Amorphous Seed Layer, Surface Treatment, and High-Polariation Magnetic Materials, Jul. 2004, IEEE, IEEE Transactions on Magnetics, vol. 40. No. 4, all pages.
Löhndorf et al., Characterization of Magnetostrictive TMR Pressure Sensors by MOKE, Journal of Magnetism and Magnetic Materials, vol. 316, (2007), pp. e223-e225.
Ma et al., NiO-Thickness Dependent Magnetic Anisotropies in Fe/NiO/Au(001) and Fe/NiO/MgO(001) Systems, Journal of Magnetism and Magnetic Materials, vol. 324, (2012), pp. 528-533.
Maehara et al., Tunnel Magnetoresistance Above 170% and Resistance-Area Product of 1 O (µm)2 Attained by In Situ Annealing of Ultra-Thin MgO Tunnel Barrier, Applied Physics Express, vol. 4, (2011), 2 pages (abstract only).
Hiroki et al., Tunnel Magnetoresistance above 170% and Resistance-Area Product of 1 ohm (micrometer)2 Attained by In Situ Annealing of Ultra-Thin MgO Tunnel Barrier, Mar. 10, 2011, Applied Physics Express 4 (2011) 033002 1-3.
Matsumoto et al., Dependence on Annealing Temperatures of Tunneling Spectra in High-Resistance CoFeB/MgO/CoFeB Magnetic Tunnel Junctions, Solid State Communications, vol. 143, (2007), pp. 574-578.
Matsumoto et al., Tunneling Spectra of Sputter-Deposited CoFeB/MgO/CoFeB Magnetic Tunnel Junctions Showing Giant Tunneling Magnetoresistance Effect, Solid State Communications, vol. 136, (2005), pp. 611-615.
Miao et al., Disturbance of Tunneling Coherence by Oxygen Vacancy in Epitaxial Fe/MgO/Fe Magnetic Tunnel Junctions, Physical Review Letters, vol. 100, (Jun. 19, 2008), pp. 246803-1-246803-4.
Miao et al., Theoretical investigation on the transition-metal borides with Ta3B4-type structure: A class of hard and refractory materials, 2011, Computational Materials Science, Elsevier, pp. 1559-1566.
Miracle et al., An Assessment of Binary Metallic Glasses: Correlations Between Structure, Glass Forming Ability and Stability (Preprint), Air Force Research Laboratory, (2011), 97 pages.
Isogami et al., "In situ heat treatment of ultrathin MgO layer for giant magnetoresistance ratio with low resistance area product in CoFeB/MgO/CoFeB magnetic tunnel junctions", Applied Physics Letters, vol. 93(19), (2008) pp. 192109-1-192109-3.
Miura et al., CoFeB/MgO Based Perpendicular Magnetic Tunnel Junctions with Stepped Structure for Symmetrizing Different Retention Times of "0" and "1" Information, 2011 Symposium on VLSI Technology (VLSIT), (Jun. 14-16, 2011), 19 pages.
Moroz et al., Modeling the Impact of Stress on Silicon Processes and Devices, Materials Science in Semiconductor Processing, vol. 6, (2003), pp. 27-36.
Moutis et al., Voltage-Induced Modification in Magnetic Coercivity of Patterned Co50Fe50 Thin Film on Piezoelectric Substrate, Journal of Magnetism and Magnetic Materials, vol. 320, (2008), pp. 1050-1055.
Nishitani et al., Magnetic Anisotropy in a Ferromagnetic (Ga,Mn)Sb Thin Film, Physica E, vol. 42, (2010), pp. 2681-2684.
S. Pinitsoontorn et al., "Three-dimensional atom probe investigation of boron distribution in CofeB/MgO/CoFeB magnetic tunnel junctions" Applied Physics Letters, vol., 93, American Institute of Physics, 2008, pp. 071901-1 to 071901-3.
Piramanayagam, S. N., Perpendicular Recording Media for Hard Disk Drives, Journal of Applied Physics, vol. 102, (2007), pp. 011301-1-011301-22.
Resnik et al., Mechanical Stress in Thin Film Microstructures on Silicon Substrate, Vacuum, vol. 80, (2005), pp. 236-240.
Rodmacq et al., Influence of Thermal Annealing on the Perpendicular Magnetic Anisotropy of Pt/Co/AlOx Trilayers, Physical Review B, vol. 79, (2009), pp. 024423-1-024423-8.
Sato et al., Perpendicular-Anisotropy CoFeB—MgO Magnetic Tunnel Junctions with a MgO/CoFeB/Ta/CoFeB/MgO Recording Structure, Applied Physics Letters, vol. 101, (2012), pp. 022414-1-022414-4.
Stone et al., Tuning of Ferromagnetism Through Anion Substitution in Ga—Mn-Pnictide Ferromagnetic Semiconductors, Physica B, vol. 401-402, (2007), pp. 454-457.

(56) References Cited

OTHER PUBLICATIONS

Tao et al., Uniform Wafer-Scale Chemical Vapor Deposition of Graphene on Evaporated Cu (1 1 1) Film with Quality Comparable to Exfoliated Monolayer, J. Physical Chemistry, vol. 116, (2012), pp. 24068-24074.

Tsunekawa et al., Effect of Capping Layer Material on Tunnel Magnetoresistance in CoFeB—MgO—CoFeB Magentic Tunnel Junctions, Digests of the IEEE International Magnetics Conference (Apr. 2005), pp. 1983-1984.

Taiwan Search Report for Roc (Taiwan) Patent Application No. 103131227, dated Nov. 29, 2015, 2 pages.

Vitos et al., The Surface Energy of Metals, Surface Science, vol. 411, (1998), pp. 186-202.

Wang et al., Exchange Coupling Between Ferromagnetic and Antiferromagnetic Layers Via Ru and Application for a Linear Magnetic Field Sensor, Journal of Applied Physics, vol. 99, (2006), pp. 08H703-1-08H703-3.

Wang et al., C-Spin Kickoff Meeting Presentation, Semiconductor Research Corp., (Mar. 26, 2013), Minneapolis, Minnesota, (available at https://www.src.org/library/publication/p066203/), 195 pages.

Wang et al., "Low-Power Non-volatile Spintronic Memory: STT-MRAM and Beyond," J. Phys. D: Applied Physics, vol. 46, (Jan. 31, 2013), pp. 1-10.

Wilson et al., New Materials for Micro-Scale Sensors and Actuators: An Engineering Review, Materials Science and Engineering R, vol. 56, (2007), pp. 1-129.

Worledge et al., Magnetoresistance Measurement of Unpatterned Magnetic Tunnel Junction Wafers by Current-In-Plane Tunneling, Applied Physics Letters, vol. 83, No. 1, (Jul. 7, 2013), pp. 84-86.

Worledge et al., Spin Torque Switching of Perpendicular Ta|CoFeB|MgO-Based Magnetic Tunnel Junctions, Applied Physics Letters, vol. 98, (2011), pp. 022501-1-022501-3.

Wu et al., Tuning Magnetic Anisotropies of Fe Films on Si(111) Substrate Via Direction Variation of Heating Current, Scientific Reports, vol. 3, (Mar. 26, 2013), pp. 1-5.

You et al., Spin Transfer Torque and Tunneling Magnetoresistance Dependences on Finite Bias Voltages and Insulator Barrier Energy, Thin Solid Films, vol. 519, (2011), pp. 8247-8251.

Yu et al., 1/f Noise in MgO Double-Barrier Magnetic Tunnel Junctions, Applied Physics Letters, vol. 98, (2011), pp. 112504-1-112504-3.

Zhang, Anisotropic Magnetomechanical Effect in Tb0.3Dy0.7Fe2 Alloy, Journal of Magnetism and Magnetic Materials, vol. 324, (2012), pp. 190-195.

Zhu et al., Magnetic Tunnel Junctions, MaterialsToday, vol. 9, No. 11, (Nov. 2006), pp. 36-45.

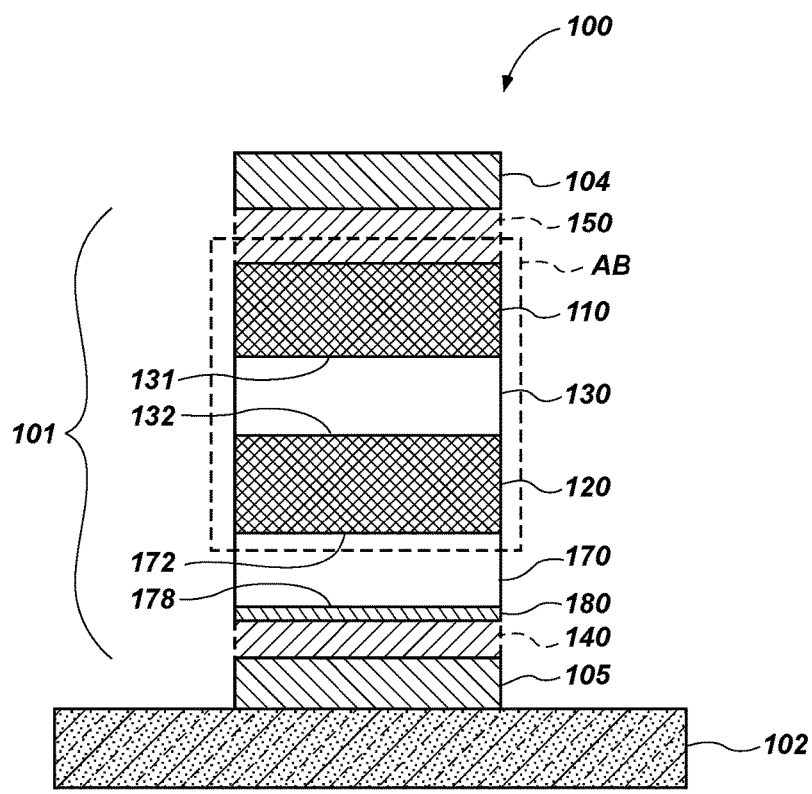
FIG. 1
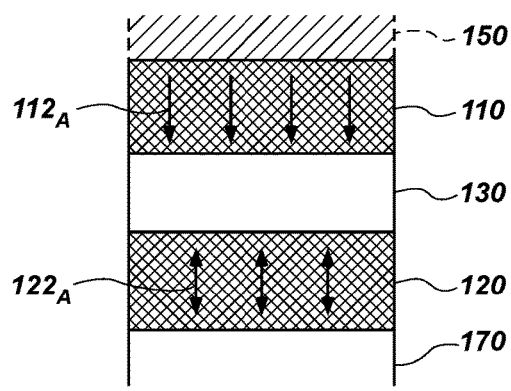 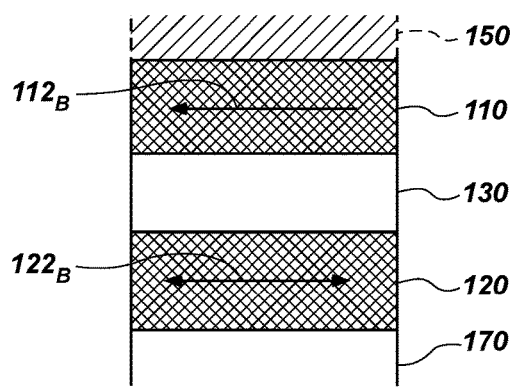
FIG. 1A FIG. 1B

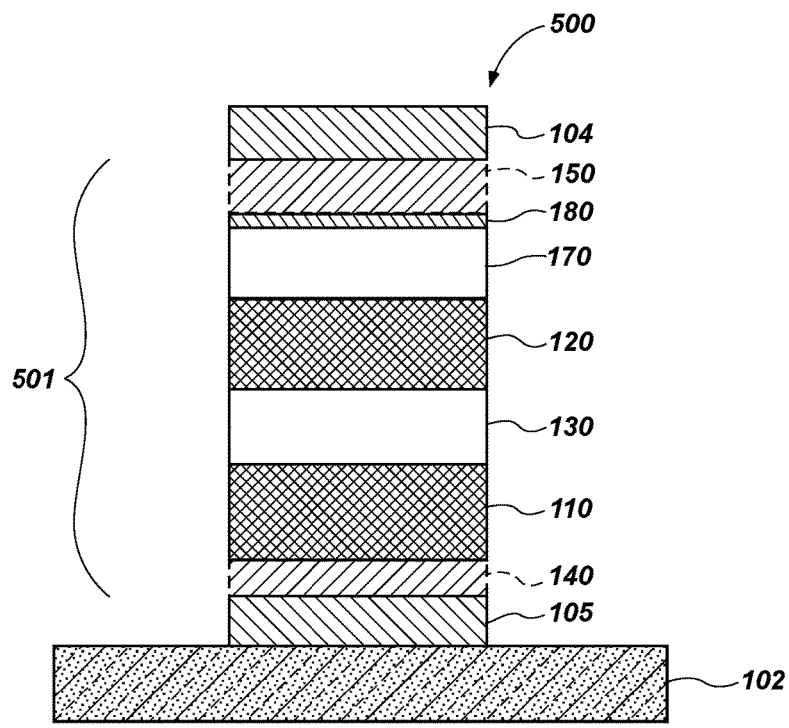
FIG. 5
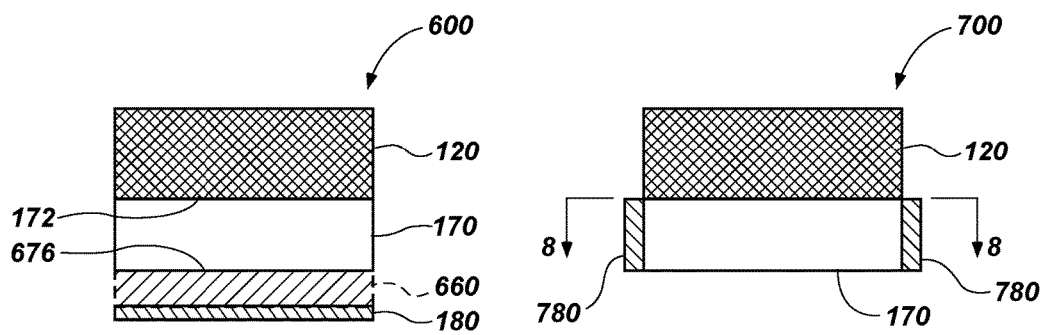
FIG. 6
FIG. 7
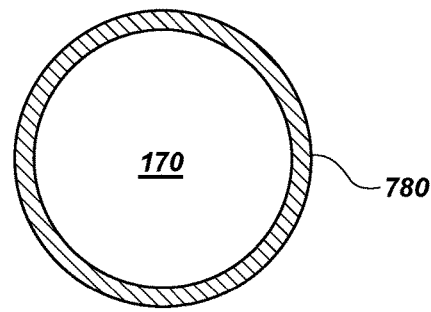
FIG. 8

MAGNETIC MEMORY CELLS AND SEMICONDUCTOR DEVICES

CROSS-REFERENCE TO RELATED APPLICATIONS

This application is a continuation of U.S. patent application Ser. No. 15/239,481, filed Aug. 17, 2016, now U.S. Pat. No. 10,020,446, issued Jul. 10, 2018, which is a divisional of U.S. patent application Ser. No. 14/026,627, filed Sep. 13, 2013, now U.S. Pat. No. 9,461,242, issued Oct. 4, 2016, the disclosure of each of which is hereby incorporated in its entirety herein by this reference.

TECHNICAL FIELD

The present disclosure, in various embodiments, relates generally to the field of memory device design and fabrication. More particularly, this disclosure relates to design and fabrication of memory cells characterized as spin torque transfer magnetic random access memory (STT-MRAM) cells.

BACKGROUND

Magnetic Random Access Memory (MRAM) is a non-volatile computer memory technology based on magnetoresistance. One type of MRAM cell is a spin torque transfer MRAM (STT-MRAM) cell, which includes a magnetic cell core supported by a substrate. The magnetic cell core includes at least two magnetic regions, for example, a "fixed region" and a "free region," with a non-magnetic region (e.g., an oxide region configured as a tunnel barrier region) between. The free regions and fixed regions may exhibit magnetic orientations that are either horizontally oriented ("in-plane") or perpendicularly oriented ("out-of-plane") with the width of the regions. The fixed region includes a magnetic material that has a substantially fixed (e.g., a non-switchable) magnetic orientation. The free region, on the other hand, includes a magnetic material that has a magnetic orientation that may be switched, during operation of the cell, between a "parallel" configuration and an "anti-parallel" configuration. In the parallel configuration, the magnetic orientations of the fixed region and the free region are directed in the same direction (e.g., north and north, east and east, south and south, or west and west, respectively). In the "anti-parallel" configuration the magnetic orientations of the fixed region and the free region are directed in opposite directions (e.g., north and south, east and west, south and north, or west and east, respectively). In the parallel configuration, the STT-MRAM cell exhibits a lower electrical resistance across the magnetoresistive elements (e.g., the fixed region and free region). This state of low electrical resistance may be defined as a "0" logic state of the MRAM cell. In the anti-parallel configuration, the STT-MRAM cell exhibits a higher electrical resistance across the magnetoresistive elements. This state of high electrical resistance may be defined as a "1" logic state of the STT-MRAM cell.

Switching of the magnetic orientation of the free region may be accomplished by passing a programming current through the magnetic cell core and the fixed and free regions therein. The fixed region polarizes the electron spin of the programming current, and torque is created as the spin-polarized current passes through the core. The spin-polarized electron current exerts the torque on the free region. When the torque of the spin-polarized electron current passing through the core is greater than a critical switching current density ($J_c$) of the free region, the direction of the magnetic orientation of the free region is switched. Thus, the programming current can be used to alter the electrical resistance across the magnetic regions. The resulting high or low electrical resistance states across the magnetoresistive elements enable the write and read operations of the MRAM cell. After switching the magnetic orientation of the free region to achieve the one of the parallel configuration and the anti-parallel configuration associated with a desired logic state, the magnetic orientation of the free region is usually desired to be maintained, during a "storage" stage, until the MRAM cell is to be rewritten to a different configuration (i.e., to a different logic state).

Some STT-MRAM cells include, in addition to the oxide region (the "intermediate oxide region") between the free region and the fixed region, another oxide region. The free region may be between the intermediate oxide region and the another oxide region. The exposure of the free region to two oxide regions may increase the free region's magnetic anisotropy ("MA") strength. For example, the oxide regions may be configured to induce surface/interfacial MA with neighboring material of, e.g., the free region. MA is an indication of the directional dependence of a magnetic material's magnetic properties. Therefore, the MA is also an indication of the strength of the material's magnetic orientation and of its resistance to alteration of the magnetic orientation. A magnetic material exhibiting a magnetic orientation with a high MA strength may be less prone to alteration of its magnetic orientation than a magnetic material exhibiting a magnetic orientation with a lower MA strength. Therefore, a free region with a high MA strength may be more stable during storage than a free region with a low MA strength.

While the dual oxide regions may increase the MA strength of the free region, compared to a free region adjacent to only one oxide region (i.e., the intermediate oxide region), the added amount of oxide material in the magnetic cell core may increase the electrical resistance (e.g., the series resistance) of the core, which lowers the effective magnetoresistance (e.g., tunnel magnetoresistance) of the cell, compared to a cell core comprising only one oxide region (i.e., the intermediate oxide region). The increased electrical resistance also increases the resistance-area ("RA") of the cell and may increase the voltage needed to switch the magnetic orientation of the free region during programming. The decreased effective magnetoresistance may degrade performance of the cell, as may the increased RA and programming voltage. Accordingly, forming STT-MRAM cells to have dual oxide regions around the free region, for high MA strength, without degrading other properties, such as magnetoresistance (e.g., tunnel magnetoresistance), RA, and programming voltage, has presented challenges.

BRIEF DESCRIPTION OF THE DRAWINGS

FIG. 1 is a cross-sectional, elevational, schematic illustration of a magnetic cell structure according to an embodiment of the present disclosure, wherein a getter region is adjacent to a base oxide region.

FIG. 1A is an enlarged view of box AB of FIG. 1, according to an embodiment of the present disclosure in which a free region and a fixed region of the magnetic cell structure of FIG. 1 exhibit perpendicular magnetic orientations.

FIG. 1B is an enlarged view of box AB of FIG. 1, according to an embodiment of the present disclosure in which a free region and a fixed region of the magnetic cell structure of FIG. 1 exhibit horizontal magnetic orientations.

FIG. 5 is a cross-sectional, elevational, schematic illustration of a magnetic cell structure according to an embodiment of the present disclosure, wherein a getter region is adjacent and above a cap oxide region that is above a free region.

FIG. 6 is a partial, cross-sectional, elevational, schematic illustration of a magnetic cell structure according to an embodiment of the present disclosure, wherein a getter region is indirectly adjacent to a base oxide region.

FIG. 7 is a partial, cross-sectional, elevational, schematic illustration of a magnetic cell structure according to an embodiment of the present disclosure, wherein a getter region laterally surrounds a base oxide region.

FIG. 8 is a plan view of the structure of FIG. 7 taken along section line 8-8.

DETAILED DESCRIPTION

Figure 2:
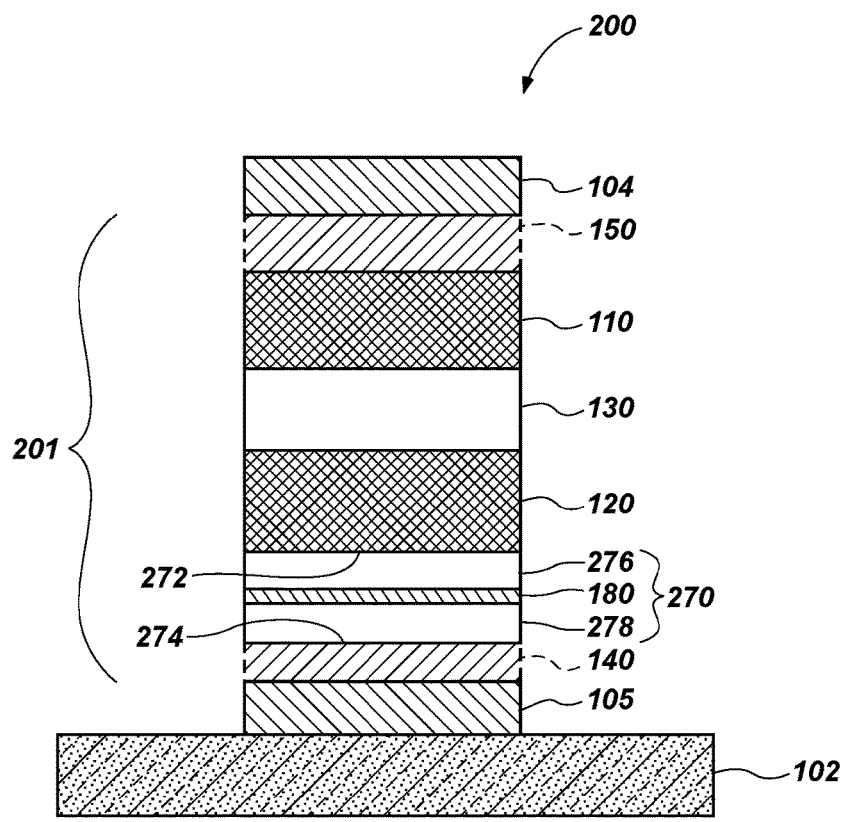
FIG. 2 is a cross-sectional, elevational, schematic illustration of a magnetic cell structure according to an embodiment of the present disclosure, wherein a getter region is within a base oxide region.

Memory cells, methods of forming memory cells, semiconductor devices, memory systems, and electronic systems are disclosed. The memory cells include a magnetic region (e.g., a free region), formed from a magnetic material, between two oxide regions, both of which may be magnetic anisotropy ("MA")-inducing regions. One of the oxide regions, e.g., positioned between the free region and another magnetic region (e.g., a fixed region) and referred to herein as the "intermediate oxide region," may be configured to function as a tunnel barrier of the memory cell. The other oxide region, referred to herein as the "secondary oxide region," may not be configured to function as a tunnel barrier. A getter material is proximate to the secondary oxide region and is formulated to remove oxygen from the secondary oxide region, reducing the electrical resistance of the secondary oxide region and, thus, avoiding substantial lowering of the effective magnetoresistance of the memory cell. The electrical resistance of the secondary oxide region may be less than about 50% (e.g., between about 1% and about 20%) of the electrical resistance of the intermediate oxide region. In some embodiments, the secondary oxide region may become electrically conductive as a result of the removal of oxygen by the getter material. The overall electrical resistance of the STT-MRAM cell may, therefore, be decreased compared to an STT-MRAM cell lacking the getter material proximate the secondary oxide region. Further, the decreased electrical resistance avoids degradation to the magnetoresistance of the cell; thus, the STT-MRAM cell with getter material proximate the secondary oxide region may have a higher effective magnetoresistance compared to an STT-MRAM cell lacking such a getter material region. Nonetheless, the two oxide regions of the getter-including STT-MRAM cell may still induce MA with the free region. Therefore, the MA strength may not be degraded, while the electrical resistance is decreased to enable a maximum tunneling magnetoresistance, a low resistance area ("RA") product, and use of a low programming voltage.

As used herein, the term "substrate" means and includes a base material or other construction upon which components, such as those within memory cells, are formed. The substrate may be a semiconductor substrate, a base semiconductor material on a supporting structure, a metal electrode, or a semiconductor substrate having one or more materials, structures, or regions formed thereon. The substrate may be a conventional silicon substrate or other bulk substrate including a semiconductive material. As used herein, the term "bulk substrate" means and includes not only silicon wafers, but also silicon-on-insulator ("SOI") substrates, such as silicon-on-sapphire ("SOS") substrates or silicon-on-glass ("SOG") substrates, epitaxial layers of silicon on a base semiconductor foundation, or other semiconductor or optoelectronic materials, such as silicon-germanium ($Si_{1-x}Ge_x$, where x is, for example, a mole fraction between 0.2 and 0.8), germanium (Ge), gallium arsenide (GaAs), gallium nitride (GaN), or indium phosphide (InP), among others. Furthermore, when reference is made to a "substrate" in the following description, previous process stages may have been utilized to form materials, regions, or junctions in the base semiconductor structure or foundation.

As used herein, the term "STT-MRAM cell" means and includes a magnetic cell structure that includes a magnetic cell core including a nonmagnetic region disposed between a free region and a fixed region. The STT-MRAM cell may be configured in a magnetic tunnel junction ("MTJ") configuration, in which the nonmagnetic region comprises an electrically insulative (e.g., dielectric) material, such as an oxide. Such an electrically-insulative, oxide, nonmagnetic region, disposed between a free region and a fixed region, is referred to herein as an "intermediate oxide region."

As used herein, the term "magnetic cell core" means and includes a memory cell structure comprising the free region and the fixed region and through which, during use and operation of the memory cell, current may be passed (i.e., flowed) to effect a parallel or anti-parallel configuration of the magnetic orientations of the free region and the fixed region.

As used herein, the term "magnetic region" means a region that exhibits magnetism. A magnetic region includes a magnetic material and may also include one or more non-magnetic materials.

As used herein, the term "magnetic material" means and includes ferromagnetic materials, ferrimagnetic materials, antiferromagnetic, and paramagnetic materials.

As used herein, the term "CoFeB material" means and includes a material comprising cobalt (Co), iron (Fe), and boron (B) (e.g., $Co_xFe_yB_z$, wherein x=10 to 80, y=10 to 80, and z=0 to 50). A CoFeB material may or may not exhibit magnetism, depending on its configuration (e.g., its thickness).

As used herein, the term "fixed region" means and includes a magnetic region within the STT-MRAM cell that includes a magnetic material and that has a fixed magnetic orientation during use and operation of the STT-MRAM cell in that a current or applied field effecting a change in the magnetization direction of one magnetic region, e.g., the free region, of the cell core may not effect a change in the magnetization direction of the fixed region. The fixed region may include one or more magnetic materials and, optionally, one or more non-magnetic materials. For example, the fixed region may be configured as a synthetic antiferromagnet (SAF) including a sub-region of ruthenium (Ru) adjoined by magnetic sub-regions. Each of the magnetic sub-regions may include one or more materials and one or more regions therein. As another example, the fixed region may be configured as a single, homogeneous magnetic material. Accordingly, the fixed region may have uniform magnetization, or sub-regions of differing magnetization that, overall, effect the fixed region having a fixed magnetic orientation during use and operation of the STT-MRAM cell.

As used herein, the term "free region" means and includes a magnetic region within the STT-MRAM cell that includes a magnetic material and that has a switchable magnetic orientation during use and operation of the STT-MRAM cell. The magnetic orientation may be switched between a parallel configuration and an anti-parallel configuration by the application of a current or applied field.

As used herein, "switching" means and includes a stage of use and operation of the memory cell during which programming current is passed through the magnetic cell core of the STT-MRAM cell to effect a parallel or anti-parallel configuration of the magnetic orientations of the free region and the fixed region.

As used herein, "storage" means and includes a stage of use and operation of the memory cell during which programming current is not passed through the magnetic cell core of the STT-MRAM cell and in which the parallel or anti-parallel configuration of the magnetic orientations of the free region and the fixed region is not purposefully altered.

As used herein, the term "vertical" means and includes a direction that is perpendicular to the width and length of the respective region. "Vertical" may also mean and include a direction that is perpendicular to a primary surface of the substrate on which the STT-MRAM cell is located.

As used herein, the term "horizontal" means and includes a direction that is parallel to at least one of the width and length of the respective region. "Horizontal" may also mean and include a direction that is parallel to a primary surface of the substrate on which the STT-MRAM cell is located.

As used herein, the term "sub-region," means and includes a region included in another region. Thus, one magnetic region may include one or more magnetic sub-regions, i.e., sub-regions of magnetic material, as well as non-magnetic sub-regions, i.e., sub-regions of non-magnetic material.

As used herein, the term "between" is a spatially relative term used to describe the relative disposition of one material, region, or sub-region relative to at least two other materials, regions, or sub-regions. The term "between" can encompass both a disposition of one material, region, or sub-region directly adjacent to the other materials, regions, or sub-regions and a disposition of one material, region, or sub-region indirectly adjacent to the other materials, regions, or sub-regions.

As used herein, the term "proximate to" is a spatially relative term used to describe disposition of one material, region, or sub-region near to another material, region, or sub-region. The term "proximate" includes dispositions of indirectly adjacent to, directly adjacent to, and internal to.

As used herein, reference to an element as being "on" or "over" another element means and includes the element being directly on top of, adjacent to, underneath, or in direct contact with the other element. It also includes the element being indirectly on top of, adjacent to, underneath, or near the other element, with other elements present therebetween. In contrast, when an element is referred to as being "directly on" or "directly adjacent to" another element, there are no intervening elements present.

As used herein, other spatially relative terms, such as "beneath," "below," "lower," "bottom," "above," "upper," "top," "front," "rear," "left," "right," and the like, may be used for ease of description to describe one element's or feature's relationship to another element(s) or feature(s) as illustrated in the figures. Unless otherwise specified, the spatially relative terms are intended to encompass different orientations of the materials in addition to the orientation as depicted in the figures. For example, if materials in the figures are inverted, elements described as "below" or "beneath" or "under" or "on bottom of" other elements or features would then be oriented "above" or "on top of" the other elements or features. Thus, the term "below" can encompass both an orientation of above and below, depending on the context in which the term is used, which will be evident to one of ordinary skill in the art. The materials may be otherwise oriented (rotated 90 degrees, inverted, etc.) and the spatially relative descriptors used herein interpreted accordingly.

As used herein, the terms "comprises," "comprising," "includes," and/or "including" specify the presence of stated features, regions, integers, stages, operations, elements, materials, components, and/or groups, but do not preclude the presence or addition of one or more other features, regions, integers, stages, operations, elements, materials, components, and/or groups thereof.

As used herein, "and/or" includes any and all combinations of one or more of the associated listed items.

As used herein, the singular forms "a," "an," and "the" are intended to include the plural forms as well, unless the context clearly indicates otherwise.

The illustrations presented herein are not meant to be actual views of any particular component, structure, device, or system, but are merely idealized representations that are employed to describe embodiments of the present disclosure.

Embodiments are described herein with reference to cross-sectional illustrations that are schematic illustrations. Accordingly, variations from the shapes of the illustrations as a result, for example, of manufacturing techniques and/or tolerances, are to be expected. Thus, embodiments described herein are not to be construed as limited to the particular shapes or regions as illustrated but may include deviations in shapes that result, for example, from manufacturing techniques. For example, a region illustrated or described as box-shaped may have rough and/or nonlinear features. Moreover, sharp angles that are illustrated may be rounded. Thus, the materials, features, and regions illustrated in the figures are schematic in nature and their shapes are not intended to illustrate the precise shape of a material, feature, or region and do not limit the scope of the present claims.

The following description provides specific details, such as material types and processing conditions, in order to provide a thorough description of embodiments of the disclosed devices and methods. However, a person of ordinary skill in the art will understand that the embodiments of the devices and methods may be practiced without employing these specific details. Indeed, the embodiments of the devices and methods may be practiced in conjunction with conventional semiconductor fabrication techniques employed in the industry.

The fabrication processes described herein do not form a complete process flow for processing semiconductor device structures. The remainder of the process flow is known to those of ordinary skill in the art. Accordingly, only the methods and semiconductor device structures necessary to understand embodiments of the present devices and methods are described herein.

Unless the context indicates otherwise, the materials described herein may be formed by any suitable technique including, but not limited to, spin coating, blanket coating, chemical vapor deposition ("CVD"), atomic layer deposition ("ALD"), plasma enhanced ALD, physical vapor deposition ("PVD"), or epitaxial growth. Depending on the specific material to be formed, the technique for depositing or growing the material may be selected by a person of ordinary skill in the art.

Unless the context indicates otherwise, the removal of materials described herein may be accomplished by any suitable technique including, but not limited to, etching, ion milling, abrasive planarization, or other known methods.

Reference will now be made to the drawings, where like numerals refer to like components throughout. The drawings are not necessarily drawn to scale.

A memory cell is disclosed. The memory cell includes a magnetic cell core that includes a free region located between two oxide regions, including an intermediate oxide region and a secondary oxide region. Both regions may be configured to induce MA (magnetic anisotropy) with the free region. The intermediate oxide region may also be configured to function as a tunnel barrier. A getter material is proximate to the secondary oxide region. The getter material has a chemical affinity for oxygen that is greater than or about equal to the chemical affinity for oxygen of the oxide material of the secondary oxide region. For example, the getter material may be formed of a metal for which the heat of formation of a metal oxide from the metal is lower than (e.g., more negative than) the heat of formation of the oxide of the secondary oxide region. Accordingly, the getter material is formulated to remove oxygen from the secondary oxide region, reducing the concentration of oxygen within the secondary oxide region and, therefore, reducing the electrical resistance of the secondary oxide region. The reduction in electrical resistance enables a higher magnetoresistance, a lower RA (resistance area) product, and a lower programming voltage, compared to an STT-MRAM cell without the getter matter. Therefore, the STT-MRAM cell may be formed to include two MA-inducing regions, providing high MA strength, without degrading tunneling magnetoresistance, RA product, or the programming voltage.

FIG. 1 illustrates an embodiment of a magnetic cell structure 100 according to the present disclosure. The magnetic cell structure 100 includes a magnetic cell core 101 over a substrate 102. The magnetic cell core 101 may be disposed between an upper electrode 104 above and a lower electrode 105 below. A conductive material, from which either or both of the upper electrode 104 and the lower electrode 105 are formed, may comprise, consist essentially of, or consist of, for example and without limitation, a metal (e.g., copper, tungsten, titanium, tantalum), a metal alloy, or a combination thereof.

The magnetic cell core 101 includes at least two magnetic regions, for example, a "fixed region" 110 and a "free region" 120. The free region 120 and the fixed region 110 may be formed from, comprise, consist essentially of, or consist of ferromagnetic materials, such as Co, Fe, Ni or their alloys, NiFe, CoFe, CoNiFe, or doped alloys CoX, CoFeX, CoNiFeX (X=B, Cu, Re, Ru, Rh, Hf, Pd, Pt, C), or other half-metallic ferromagnetic materials, such as, for example, NiMnSb and PtMnSb. In some embodiments, for example, the free region 120, the fixed region 110, or both may be formed, in whole or in part, from $Co_xFe_yB_z$, wherein x=10 to 80, y=10 to 80, and z=0 to 50. In other embodiments, the free region 120, the fixed region 110, or both may be formed, in whole or in part, of iron (Fe) and boron (B) and not include cobalt (Co). The compositions and structures (e.g., the thicknesses and other physical dimensions) of the free region 120 and the fixed region 110 may be the same or different.

Alternatively or additionally, in some embodiments, the free region 120, the fixed region 110, or both, may be formed from or comprise a plurality of materials, some of which may be magnetic materials and some of which may be nonmagnetic materials. For example, some such multi-material free regions, fixed regions, or both, may include multiple sub-regions. For example, and without limitation, the free region 120, the fixed region 110, or both, may be formed from or comprise repeating sub-regions of cobalt and platinum, wherein a sub-region of platinum may be disposed between sub-regions of cobalt. As another example, without limitation, the free region 120, the fixed region 110, or both, may comprise repeating sub-regions of cobalt and nickel, wherein a sub-region of nickel may be disposed between sub-regions of cobalt. Thus, either or both of the fixed region 110 and the free region 120 may be formed homogeneously or, optionally, may be formed to include more than one sub-region of magnetic material and, optionally, nonmagnetic material (e.g., coupler material).

In some embodiments, both the fixed region 110 and the free region 120 may be formed, in whole or in part, from the same material, e.g., a CoFeB material. However, in some such embodiments, the relative atomic ratios of Co:Fe:B may be different in the fixed region 110 and the free region 120. One or both of the fixed region 110 and the free region 120 may include sub-regions of magnetic material that include the same elements as one another, but with different relative atomic ratios of the elements therein. For example, and without limitation, a sub-region of the free region 120 may have a lower concentration of boron (B) compared to CoFe than another sub-region of the free region 120.

In some embodiments, the memory cells of embodiments of the present disclosure may be configured as out-of-plane STT-MRAM cells. "Out-of-plane" STT-MRAM cells, include magnetic regions exhibiting a magnetic orientation that is predominantly oriented in a vertical direction. For example, as illustrated in FIG. 1A, which is a view of box AB of FIG. 1, the STT-MRAM cell may be configured to exhibit a vertical magnetic orientation in at least one of the magnetic regions (e.g., the fixed region 110 and the free region 120). The vertical magnetic orientation exhibited may be characterized by perpendicular magnetic anisotropy ("PMA") strength. As illustrated in FIG. 1A by arrows $112_A$ and double-pointed arrows $122_A$, in some embodiments, each of the fixed region 110 and the free region 120 may exhibit a vertical magnetic orientation. The magnetic orientation of the fixed region 110 may remain directed in essentially the same direction throughout operation of the STT-MRAM cell, for example, in the direction indicated by arrows 112$_A$ of FIG. 1A. The magnetic orientation of the free region 120, on the other hand, may be switched, during operation of the cell, between a parallel configuration and an anti-parallel configuration, as indicated by double-pointed arrows 122$_A$ of FIG. 1A.

In other embodiments, the memory cells of embodiments of the present disclosure may be configured as in-plane STT-MRAM cells. "In-plane" STT-MRAM cells include magnetic regions exhibiting a magnetic origination that is predominantly oriented in a horizontal direction. For example, as illustrated in FIG. 1B, which is a view of box AB of FIG. 1, the STT-MRAM cell may be configure to exhibit a horizontal magnetic orientation in at least one of the magnetic regions (e.g., the fixed region 110 and the free region 120). The horizontal orientation exhibited may be characterized by horizontal magnetic anisotropy ("HMA") strength. As illustrated in FIG. 1B by arrows 112$_B$ and double-pointed arrows 122$_B$, in some embodiments, each of the fixed region 110 and the free region 120 may exhibit a horizontal magnetic orientation. The magnetic orientation of the fixed region 110 may remain directed in essentially the same direction throughout operation of the STT-MRAM cell, for example, in the direction indicated by arrows 112$_B$ of FIG. 1B. The magnetic orientation of the free region 120, on the other hand, may be switched, during operation of the cell, between a parallel configuration and an anti-parallel configuration, as indicated by double-pointed arrows 122$_B$ of FIG. 1B.

With continued reference to FIG. 1, an intermediate oxide region 130 may be disposed between the free region 120 and the fixed region 110. The intermediate oxide region 130 may be configured as a tunnel region and may contact the fixed region 110 along interface 131 and may contact the free region 120 along interface 132. The intermediate oxide region 130 may be formed from, comprise, consist essentially of, or consist of a nonmagnetic oxide material, e.g., magnesium oxide (MgO), aluminum oxide (Al$_2$O$_3$), titanium oxide (TiO$_2$), or other oxide materials of conventional tunnel barrier regions. One or more nonmagnetic oxide materials may be included. In some embodiments, additional non-oxide materials may be included. The intermediate oxide region 130 may, thus, be formed as a homogeneous region or as a region with a heterogeneous mixture or distinctive sub-regions of one or more materials.

One or more lower intermediary regions 140 may, optionally, be disposed over the lower electrode 105 and under the fixed region 110 and the free region 120. The lower intermediary regions 140 may include foundation materials formulated and configured to provide a smooth template upon which overlying materials are formed and to enable formation of overlying materials at desired crystalline structures. The lower intermediary regions 140 may alternatively or additionally include material configured to inhibit diffusion, during operation of the memory cell, between the lower electrode 105 and material overlying the lower intermediary regions 140. For example, and without limitation, the lower intermediary regions 140 may be formed from, comprise, consist essentially of, or consist of a material comprising at least one of cobalt (Co) and iron (Fe) (e.g., a CoFeB material); a nonmagnetic material (e.g., a metal (e.g., tantalum (Ta), titanium (Ti), ruthenium (Ru), tungsten (W)), a metal nitride (e.g., tantalum nitride (TaN), titanium nitride (TiN)), a metal alloy); or any combination thereof. In some embodiments, the lower intermediary regions 140, if included, may be incorporated with the lower electrode 105. For example, the lower intermediary regions 140 may include or consist of an upper-most sub-region of the lower electrode 105.

One or more upper intermediary regions 150 may, optionally, be disposed over the magnetic regions (e.g., the fixed region 110 and the free region 120) of the magnetic cell core 101. The upper intermediary regions 150, if included, may be configured to ensure a desired crystal structure in neighboring materials, to aid in patterning processes during fabrication of the magnetic cell, or to function as a diffusion barrier. In some embodiments, the upper intermediary regions 150, if present, may be formed from, comprise, consist essentially of, or consist of a conductive material (e.g., one or more materials such as copper (Cu), tantalum (Ta), titanium (Ti), tungsten (W), ruthenium (Ru), tantalum nitride (TaN), or titanium nitride Ta(N)). In some embodiments, the upper intermediary regions 150, if included, may be incorporated with the upper electrode 104. For example, the upper intermediary regions 150 may include or consist of a lower-most sub-region of the upper electrode 104.

The magnetic cell core 101 also includes a secondary oxide region 170 adjacent to the free region 120. The secondary oxide region 170 may be formed over the lower electrode 105 and, if present, the lower intermediary regions 140. The secondary oxide region 170 may be formed from, comprise, consist essentially of, or consist of, for example and without limitation, a nonmagnetic oxide material (e.g., magnesium oxide (MgO), aluminum oxide (Al$_2$O$_3$), titanium oxide (TiO$_2$), or other oxide materials of conventional tunnel barrier regions). In some embodiments, the secondary oxide region 170 may be formed from the same material from which the intermediate oxide region 130 is formed, though the relative atomic ratios of the elements of such material may be different in the secondary oxide region 170 and the intermediate oxide region 130. For example, both the secondary oxide region 170 and the intermediate oxide region 130 may be formed from MgO. However, as discussed below, the secondary oxide region 170 may have a lower oxygen concentration than the intermediate oxide region 130.

A getter region 180 is formed proximate to the secondary oxide region 170. In some embodiments, as illustrated in FIG. 1, the getter region 180 may be adjacent (e.g., directly below) the secondary oxide region 170. Thus, while the secondary oxide region 170 may be adjacent to the free region 120 along an upper surface, e.g., at interface 172, the secondary oxide region 170 may be adjacent to the getter region 180 along an opposite, lower surface, e.g., at interface 178.

The getter region 180 is formulated and configured to remove oxygen from the secondary oxide region 170 so as to lower the oxygen concentration in, and thus the electrical resistance of, the secondary oxide region 170, which maximizes the magnetoresistance of the magnetic cell core 101. For example, the getter region 180 may be formed from, comprise, consist essentially of, or consist of a material having a chemical affinity for oxygen that is about equal to or greater than the chemical affinity for oxygen of the material of the secondary oxide region 170, such that the material of the getter region 180 (referred to herein as the "getter material") is formulated to compete for the oxygen of the secondary oxide region 170. In embodiments in which the getter material includes a metal, the metal-oxide heat of formation is an indication of the chemical affinity of the getter material for oxygen. Therefore, the getter material of the getter region 180 may have a metal-oxide heat of formation that is about the same as (e.g., not greater than about 10% higher than) or less than the heat of formation of the oxide of the secondary oxide region 170.

For example, and without limitation, in embodiments in which the secondary oxide region 170 is formed of magnesium oxide (MgO), which has a metal-oxide heat of formation of about −6.29 (eV), the getter material of the getter region 180 may be formed from, comprise, consist essentially of, or consist of a metal having a metal-oxide heat of formation of equal to or less than about −5.66 (eV), e.g., calcium (Ca), strontium (Sr), aluminum (Al), barium (Ba), zirconium (Zr), compounds thereof, or combinations thereof. Calcium oxide (CaO) has a metal-oxide heat of formation of about −6.58 (eV) (i.e., less than the heat of formation of MgO). Strontium oxide (SrO) has a metal-oxide heat of formation of about −6.13 (eV) (i.e., only about 2.5% higher than the heat of formation of MgO). Aluminum oxide ($Al_2O_3$) has a metal-oxide heat of formation of about −5.79 (eV) (i.e., only about 7.9% higher than the heat of formation of MgO). Barium oxide (BaO) and zirconium oxide ($ZrO_2$) have metal-oxide heats of formation of about −5.68 (eV) (i.e., only about 9.7% higher than the heat of formation of MgO). Thus, the getter material of the getter region 180 may be selected to compete for oxygen with the material of the secondary oxide region 170.

The getter region 180 may be formed as a homogeneous region of a pure, elemental metal having the desired chemical affinity (e.g., metal-oxide heat of formation) for oxygen or of a compound of such metal. For example, in embodiments in which the secondary oxide region 170 is formed of magnesium oxide (MgO), the getter region 180 may be formed from pure calcium (Ca) or from a calcium compound (e.g., calcium carbonate ($CaCO_3$)). In other embodiments, the getter region 180 may include the getter material (e.g., the metal) embedded in a carrier material, e.g., magnesium oxide (MgO), titanium oxide (TiO). However, it is contemplated that the getter region 180 may be formulated and configured to provide sufficient free (i.e., available for chemical reaction and/or bonding with oxygen) metal atoms to accomplish attraction and removal of oxygen from the secondary oxide region 170 to effect a reduction in the oxygen concentration of and the electrical resistance of the secondary oxide region 170. For example, the getter region 180 may be formulated to include a concentration of free metal and may be configured to have an amount (e.g., thickness) that enables removal of a desired amount of oxygen from the secondary oxide region 170. In embodiments in which the concentration of free metal in the getter material is low, the getter region 180 may be formed to be thick; whereas, in embodiments in which the concentration of free metal in the getter material is high, the getter region 180 may be formed to be thin to accomplish the same removal of oxygen from the secondary oxide region 170.

The removal of oxygen from the secondary oxide region 170 by the getter region 180 may be initiated by annealing the materials of the magnetic cell core 101 during fabrication thereof. In such embodiments, the temperature and time of the anneal, which may be carried out in one or more stages, may be tailored to achieve a desired transfer of oxygen from the secondary oxide region 170 to the getter region 180. Higher anneal temperatures and longer anneal times may promote more oxygen removal compared to lower anneal temperatures and shorter anneal times. It is contemplated that the transfer of oxygen from the secondary oxide region 170 to the getter region 180 be substantially permanent, such that, once transferred, oxygen may not diffuse back to the secondary oxide region 170.

At least in embodiments in which the intermediate oxide region 130 and the secondary oxide region 170 are formed from the same oxide material (e.g., MgO), the resulting magnetic cell core 101, after transfer of oxygen between the secondary oxide region 170 and the getter region 180, includes the secondary oxide region 170 that has a lower concentration of oxygen compared to the intermediate oxide region 130. In this or other embodiments, the secondary oxide region 170 has a lower electric resistance compared to the intermediate oxide region 130. For example, and without limitation, the secondary oxide region 170 may have an electrical resistance that is less than about 50% (e.g., between about 1% and about 20%) of the electrical resistance of the intermediate oxide region 130. In some embodiments, the secondary oxide region 170 may be electrically conductive as a result of the oxygen removal. Thus, as described herein, the secondary oxide region 170 may be electrically resistive, though less so than the intermediate oxide region 130, or may be electrically conductive, both alternatives encompassed by the description of "lower electrical resistance," as used herein. Thus, the secondary oxide region 170 does not degrade (e.g., substantially decrease) the magnetoresistance of the cell.

Not all of the oxygen in the secondary oxide region 170 may be removed by the getter region 180. Rather, the getter region 180 may be formulated and configured to remove only a portion of the oxygen, to leave a minimal oxygen concentration in the secondary oxide region 170. It is contemplated that the minimal oxygen concentration is a concentration sufficient to enable the secondary oxide region 170 to continue to induce surface/interface MA with the free region 120. In some embodiments, the resulting, lowered oxygen concentration in the secondary oxide region 170 may be consistent throughout the secondary oxide region 170. In other embodiments, the secondary oxide region 170 may have a gradient of oxygen, after the transfer of oxygen from the secondary oxide region 170 to the getter region 180. Such oxygen gradient may include a greater concentration proximate to the interface 172 with the free region 120 and a lesser oxygen concentration proximate to the interface 178 with the getter region 180. In such embodiments, the oxygen concentration may subsequently equilibrate to a substantially-consistent oxygen concentration throughout the secondary oxide region 170.

It is contemplated that the getter region 180 be physically isolated from the intermediate oxide region 130 to inhibit the getter region 180 from removing oxygen from and lowering the oxygen concentration of the intermediate oxide region 130. Therefore, as illustrated in FIG. 1, the getter region 180 may be spaced from the intermediate oxide region 130 by other regions of the magnetic cell core 101, including, for example and without limitation, the secondary oxide region 170 and the free region 120. In such embodiments, the getter region 180 may not chemically interact with the intermediate oxide region 130.

In one embodiment of the present disclosure, the magnetic cell structure 100 includes the getter region 180 formed of calcium (Ca) or a calcium compound (e.g., $CaCO_3$), the secondary oxide region 170 formed of magnesium oxide (MgO), the free region 120 formed of a CoFeB material, the intermediate oxide region 130 formed of MgO, and the fixed region 110 formed at least partially of a CoFeB material. Due to the lower heat of formation of CaO (i.e., −6.58 (eV)) compared to the heat of formation of MgO (i.e., −6.28 (eV)), oxygen from the secondary oxide region 170 transfers to the getter region 180. Thus, the getter region 180 includes Ca and oxygen, which oxygen is derived from the secondary oxide region 170. Moreover, though both the secondary oxide region 170 and the intermediate oxide region 130, of this embodiment, are formed from the same material, MgO, the secondary oxide region 170 of the resulting magnetic cell core 101 has a lower concentration of oxygen and a lower electrical resistance than the intermediate oxide region 130. The secondary oxide region 170 may have an electrical resistance that is less than about 20% that of the intermediate oxide region 130.

Though, in FIG. 1, the getter region 180 is directly adjacent and below the secondary oxide region 170, in other embodiments, such as that of FIG. 2, the getter region 180 may be proximate to the secondary oxide region 170 by being located internal to a secondary oxide region 270. For example, the getter region 180 may be a central sub-region of the secondary oxide region 270, with an upper oxide sub-region 276 over the getter region 180 and a lower oxide sub-region 278 under the getter region 180. The upper oxide sub-region 276 may be adjacent to the free region 120 along interface 272, and the lower oxide sub-region 278 may be adjacent to the lower electrode 105 or, if present, the lower intermediary regions 140 along interface 274.

In other embodiments, the getter region 180 may not be a distinctive region proximate to (e.g., adjacent to or internal to) the secondary oxide region 170 (FIG. 1), but may be a region of the getter material embedded within a material neighboring the secondary oxide region 170. In any respect, the getter material is proximate to the secondary oxide region 170 and is configured and formulated to remove oxygen from the secondary oxide region 170 to lower the oxygen concentration and the electrical resistance of the secondary oxide region 170.

Accordingly, disclosed is a memory cell comprising a magnetic cell core. The magnetic cell core comprises a magnetic region exhibiting a switchable magnetic orientation. Another magnetic region exhibits a fixed magnetic orientation. An intermediate oxide region is disposed between the magnetic region and the another magnetic region. Another oxide region is spaced from the intermediate oxide region by the magnetic region. The another oxide region has a lower electrical resistance than the intermediate oxide region. A getter region is proximate to the another oxide region and comprises oxygen and a metal.

Forming memory cells of the present disclosure may include sequentially forming the material or materials of each region from bottom to top. Therefore, for example, to form the magnetic cell structure 100 of FIG. 1, the conductive material of the lower electrode may be formed over the substrate 102. Then, the materials of the lower intermediary regions 140, if included, may be formed over the conductive material. Then, the getter material of the getter region 180 may be formed (e.g., by sputtering, CVD, PVD, ALD, or other known deposition technique). The oxide material of the secondary oxide region 170 may be formed over the getter material, and the magnetic material of the free region 120 may be formed over the oxide material. The oxide material of the intermediate oxide region 130 may then be formed over the magnetic material of the free region 120. The magnetic material of the fixed region 110 may be formed over the oxide material of the intermediate oxide region 130. The material of the upper intermediary regions 150, if included, may be formed thereover. Finally, the conductive material of the upper electrode 104 may be formed. The materials may then be patterned, in one or more stages, to form the structure of the magnetic cell core 101. Techniques for patterning structures, such as precursor structures of the materials described to form structures such as the magnetic cell structure 100 of FIG. 1, are known in the art and so are not described in detail.

A magnetic cell structure 200 of FIG. 2 may be similarly formed, with the exception that formation of the oxide material of the secondary oxide region 270 may be formed in multiple stages to form the getter region 180 between the lower oxide sub-region 278 and the upper oxide sub-region 276.

Figures 3, 4:
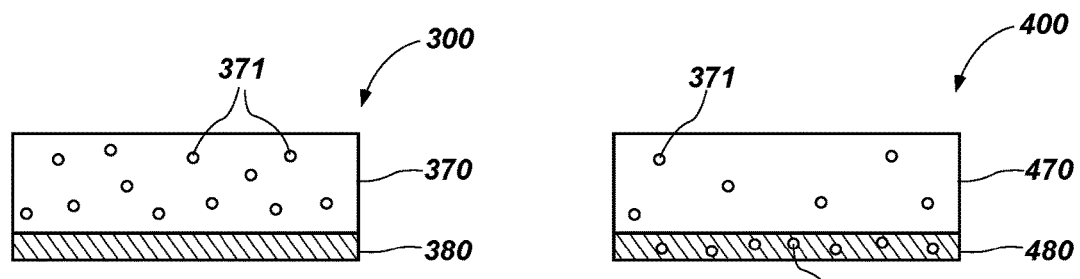
FIG. 3 is a partial, cross-sectional, elevational, schematic illustration of a magnetic cell structure during a stage of processing, prior to transfer of oxygen from an oxide region to a proximate getter region.
FIG. 4 is a partial, cross-sectional, elevational, schematic illustration of a magnetic cell structure during a stage of processing following that of FIG. 3 and following transfer of oxygen from the oxide region to the proximate getter region.

At least after formation of the getter material of the getter region 180 and the oxide material of the secondary oxide region (e.g., the secondary oxide region 170 of FIG. 1, the secondary oxide region 270 of FIG. 2), oxygen may be transferred (e.g., during an anneal) between the secondary oxide region (e.g., 170 of FIG. 1, 270 of FIG. 2) and the getter region 180. With reference to FIG. 3, illustrated is a partial cell core structure 300 in which an oxide material 370, comprising oxygen 371, is proximate to a getter material 380. FIG. 3 may represent the state of the oxide material 370 and the getter material 380 at initial formation of the materials. After time and, in some embodiments, after anneal, at least some of the oxygen 371 diffuses from the oxide material 370 to the getter material 380, forming, as illustrated in FIG. 4, a partial cell core structure 400 having oxide material 470, depleted in oxygen, and getter material 480, enriched in oxygen. At least in some embodiments, some of the oxygen 371 remains in the depleted oxide material 470 such that the depleted oxide material 470, remains formulated and configured to induce MA with the free region 120. The electrical resistance of the depleted oxide material 470 (FIG. 4) is lower than the electrical resistance of the oxide material 370 (FIG. 3).

One or more anneal stages may be carried out during or after formation of the materials of the magnetic cell core 101. In some embodiments, the anneal may be carried out after patterning.

Though in the embodiments of FIGS. 1 and 2, the free region 120 is illustrated as being closer to the substrate 102 than the fixed region 110, in other embodiments, the fixed region 110 may be closer to the substrate 102. For example, with reference to FIG. 5, a magnetic cell structure 500, according to another embodiment of the present disclosure, may alternatively include a magnetic cell core 501 that comprises, from bottom (proximate to the substrate 102, the lower electrode 105, and, if included, the lower intermediary regions 140) to top (proximate to the upper electrode 104 and, if included, the upper intermediary regions 150) the fixed region 110, the intermediate oxide region 130, the free region 120, and the secondary oxide region 170. The getter region 180 may be proximate to the secondary oxide region 170, for example, adjacent and over the secondary oxide region 170 (as in FIG. 5), or internal to the secondary oxide region 170 (as in FIG. secondary oxide region 270 of FIG. 2).

At least after formation of the secondary oxide region 170 and the getter region 180, oxygen may be transferred from the secondary oxide region 170 to the getter region 180 to lower the oxygen concentration and the electrical resistance of the secondary oxide region 170. In the embodiment of FIG. 5, the oxygen is transferred upward.

Accordingly, disclosed is a method of forming a magnetic memory cell. The method comprises forming a free region between an intermediate oxide region and another oxide region. A getter material is formed proximate to the another oxide region. Oxygen is transferred from the another oxide region to the getter material to decrease an electrical resistance of the another oxide region.

In some embodiments, the secondary oxide region 170 and the getter region 180 may not be in direct contact. For example, as illustrated in FIG. 6, a partial cell core structure 600 may include an intermediate region 660 between the secondary oxide region 170 and the getter region 180, such that the secondary oxide region 170 contacts the intermediate region 660 along interface 676. The intermediate region 660 may be formulated to permit diffusion of oxygen from the secondary oxide region 170 to the getter region 180. Therefore, even with the secondary oxide region 170 proximate to, but not directly adjacent to, the getter region 180, the proximity of the getter region 180 to the secondary oxide region 170 may enable the reduction of the oxygen concentration and the electrical resistance of the secondary oxide region 170.

With reference to FIGS. 7 and 8, in some embodiments, the getter material of a partial cell core structure 700 may be proximate to the secondary oxide region 170 by being laterally adjacent thereto. Thus, a getter region 780 may laterally surround the secondary oxide region 170 and may remove oxygen from and reduce the electrical resistance of the secondary oxide region 170.

Figure 9:
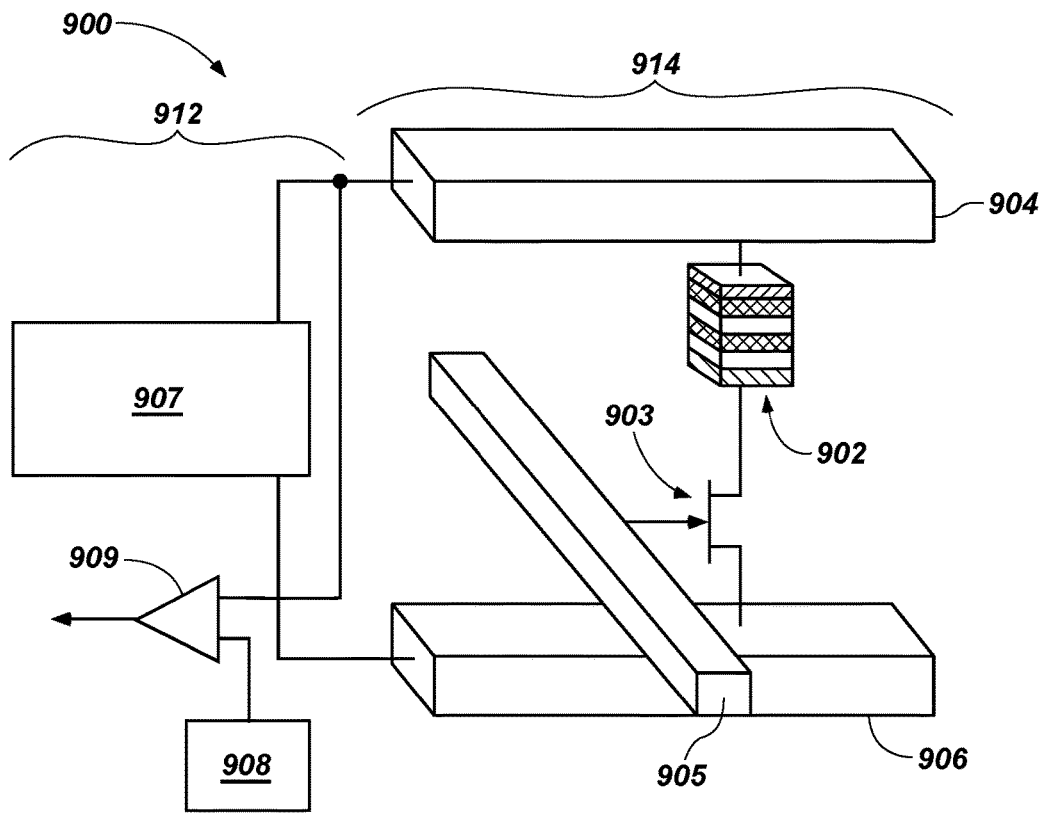
FIG. 9 is a schematic diagram of an STT-MRAM system including a memory cell having a magnetic cell structure according to an embodiment of the present disclosure.

With reference to FIG. 9, illustrated is an STT-MRAM system 900 that includes peripheral devices 912 in operable communication with an STT-MRAM cell 914, a grouping of which may be fabricated to form an array of memory cells in a grid pattern including a number of rows and columns, or in various other arrangements, depending on the system requirements and fabrication technology. The STT-MRAM cell 914 includes a magnetic cell core 902, an access transistor 903, a conductive material that may function as a data/sense line 904 (e.g., a bit line), a conductive material that may function as an access line 905 (e.g., a word line), and a conductive material that may function as a source line 906. The peripheral devices 912 of the STT-MRAM system 900 may include read/write circuitry 907, a bit line reference 908, and a sense amplifier 909. The cell core 902 may be any one of the magnetic cell cores (e.g., the magnetic cell core 101 (FIG. 1), the magnetic cell core 201 (FIG. 2), the magnetic cell core 501 (FIG. 5)) described above. Due to the structure of the cell core 902, the method of fabrication, or both, the STT-MRAM cell 914 may include a free region 120 (FIG. 1) between two MA-inducing, oxide regions (e.g., the intermediate oxide region 130 (FIG. 1) and the secondary oxide region 170 (FIG. 1)) with the electrical resistance contribution from the secondary oxide region 170 being less than about 50% of that of the intermediate oxide region 130. Therefore, the STT-MRAM cell 914 may have high MA strength, high magnetoresistance, a low RA product, and low programming voltage.

In use and operation, when an STT-MRAM cell 914 is selected to be programmed, a programming current is applied to the STT-MRAM cell 914, and the current is spin-polarized by the fixed region of the cell core 902 and exerts a torque on the free region of the cell core 902, which switches the magnetization of the free region to "write to" or "program" the STT-MRAM cell 914. In a read operation of the STT-MRAM cell 914, a current is used to detect the resistance state of the cell core 902.

To initiate programming of the STT-MRAM cell 914, the read/write circuitry 907 may generate a write current (i.e., a programming current) to the data/sense line 904 and the source line 906. The polarity of the programming voltage between the data/sense line 904 and the source line 906 determines the switch in magnetic orientation of the free region in the cell core 902. By changing the magnetic orientation of the free region with the spin polarity, the free region is magnetized according to the spin polarity of the programming current, and the programmed logic state is written to the STT-MRAM cell 914.

To read the STT-MRAM cell 914, the read/write circuitry 907 generates a read voltage to the data/sense line 904 and the source line 906 through the cell core 902 and the access transistor 903. The programmed state of the STT-MRAM cell 914 relates to the electrical resistance across the cell core 902, which may be determined by the voltage difference between the data/sense line 904 and the source line 906. Thus, the lower electrical resistance of the STT-MRAM cell 914, due to the lowered electrical resistance of the secondary oxide region 170 (FIG. 1) due to the getter region 180 (FIG. 1), enables use of a lower programming voltage. The STT-MRAM cell 914 may have a higher effective magnetoresistance, due to the getter region 180 (FIG. 1), which may further enhance performance of the STT-MRAM cell 914. In some embodiments, the voltage difference may be compared to the bit line reference 908 and amplified by the sense amplifier 909.

FIG. 9 illustrates one example of an operable STT-MRAM system 900. It is contemplated, however, that the magnetic cell cores (e.g., the magnetic cell core 101 (FIG. 1), the magnetic cell core 201 (FIG. 2), the magnetic cell core 501 (FIG. 5)) may be incorporated and utilized within any STT-MRAM system configured to incorporate a magnetic cell core having magnetic regions.

Accordingly, disclosed is a spin torque transfer magnetic random access memory (STT-MRAM) system comprising STT-MRAM cells. At least one STT-MRAM cell of the STT-MRAM cells comprises a pair of magnetic regions and a pair of oxide regions. The pair of magnetic regions comprises a magnetic region, exhibiting a switchable magnetic orientation, and another magnetic region, exhibiting a fixed magnetic orientation. The pair of oxide regions comprises an intermediate oxide region and another oxide region. The intermediate oxide region is between the magnetic region and the another magnetic region. The another oxide region is adjacent a surface of the magnetic region opposite an interface between the intermediate oxide region and the magnetic region. The another oxide region has a lower electrical resistance than the intermediate oxide region. The at least one STT-MRAM cell also comprises a getter region proximate to the another oxide region. The getter region comprises a metal and oxygen. At least one peripheral device is in operable communication with the at least one STT-MRAM cell. At least one of an access transistor, a bit line, a word line, and a source line are in operable communication with the magnetic cell core.

Figure 10:
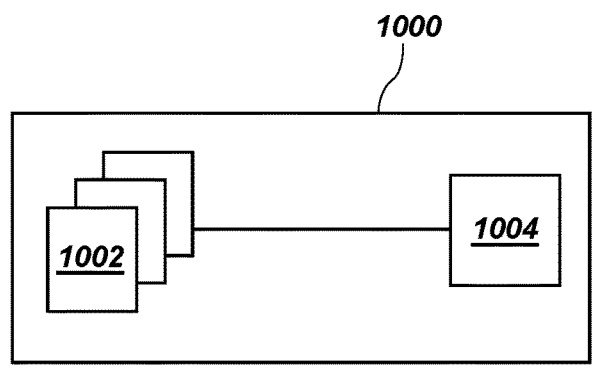
FIG. 10 is a simplified block diagram of a semiconductor device structure including memory cells having a magnetic cell structure according to an embodiment of the present disclosure.

With reference to FIG. 10, illustrated is a simplified block diagram of a semiconductor device 1000 implemented according to one or more embodiments described herein. The semiconductor device 1000 includes a memory array 1002 and a control logic component 1004. The memory array 1002 may include a plurality of the STT-MRAM cells 914 (FIG. 9) including any of the magnetic cell cores (e.g., the magnetic cell core 101 (FIG. 1), the magnetic cell core 201 (FIG. 2), the magnetic cell core 501 (FIG. 5)) discussed above, which magnetic cell cores (e.g., the magnetic cell core 101 (FIG. 1), the magnetic cell core 201 (FIG. 2), the magnetic cell core 501 (FIG. 5)) may have been formed according to a method described above and may be operated according to a method described above. The control logic component 1004 may be configured to operatively interact with the memory array 1002 so as to read from or write to any or all memory cells (e.g., STT-MRAM cell 914 (FIG. 9)) within the memory array 1002.

Accordingly, disclosed is a semiconductor device comprising a spin torque transfer magnetic random access memory (STT-MRAM) array comprising STT-MRAM cells. At least one STT-MRAM cell of the STT-MRAM cells comprises an intermediate oxide region between a free region and a fixed region. Another oxide region is adjacent to the free region and is spaced from the intermediate oxide region. The another oxide region has a lower electrical resistance than the intermediate oxide region. A getter region is proximate the another oxide region and comprises a metal having a metal-oxide heat of formation that is less than 10% greater than a heat of formation of an oxide of the another oxide region.

Figure 11:
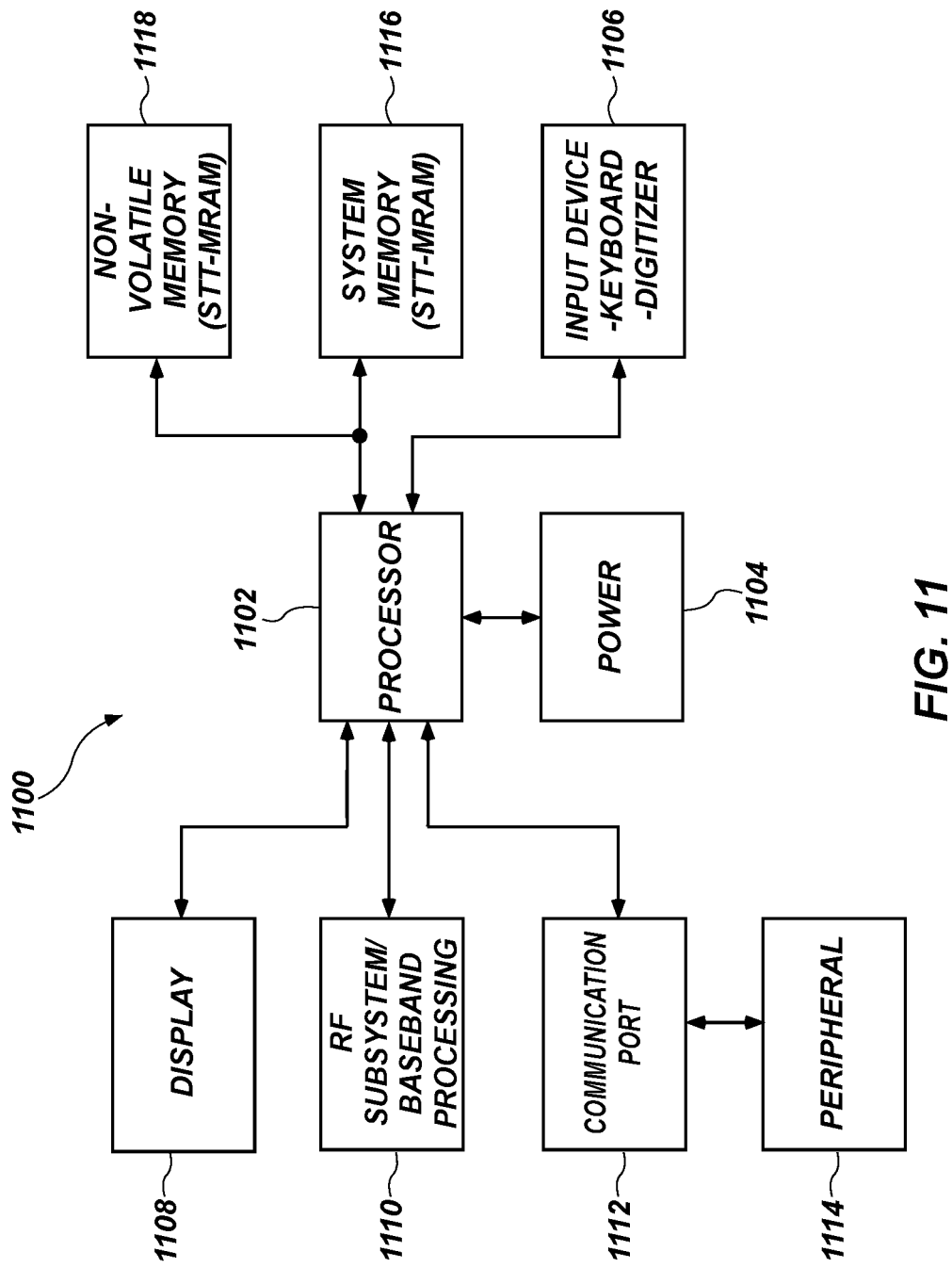
FIG. 11 is a simplified block diagram of a system implemented according to one or more embodiments of the present disclosure.

With reference to FIG. 11, depicted is a processor-based system 1100. The processor-based system 1100 may include various electronic devices manufactured in accordance with embodiments of the present disclosure. The processor-based system 1100 may be any of a variety of types such as a computer, pager, cellular phone, personal organizer, control circuit, or other electronic device. The processor-based system 1100 may include one or more processors 1102, such as a microprocessor, to control the processing of system functions and requests in the processor-based system 1100. The processor 1102 and other subcomponents of the processor-based system 1100 may include magnetic memory devices manufactured in accordance with embodiments of the present disclosure.

The processor-based system 1100 may include a power supply 1104 in operable communication with the processor 1102. For example, if the processor-based system 1100 is a portable system, the power supply 1104 may include one or more of a fuel cell, a power scavenging device, permanent batteries, replaceable batteries, and rechargeable batteries. The power supply 1104 may also include an AC adapter; therefore, the processor-based system 1100 may be plugged into a wall outlet, for example. The power supply 1104 may also include a DC adapter such that the processor-based system 1100 may be plugged into a vehicle cigarette lighter or a vehicle power port, for example.

Various other devices may be coupled to the processor 1102 depending on the functions that the processor-based system 1100 performs. For example, a user interface 1106 may be coupled to the processor 1102. The user interface 1106 may include input devices such as buttons, switches, a keyboard, a light pen, a mouse, a digitizer and stylus, a touch screen, a voice recognition system, a microphone, or a combination thereof. A display 1108 may also be coupled to the processor 1102. The display 1108 may include an LCD display, an SED display, a CRT display, a DLP display, a plasma display, an OLED display, an LED display, a three-dimensional projection, an audio display, or a combination thereof. Furthermore, an RF sub-system/baseband processor 1110 may also be coupled to the processor 1102. The RF sub-system/baseband processor 1110 may include an antenna that is coupled to an RF receiver and to an RF transmitter (not shown). A communication port 1112, or more than one communication port 1112, may also be coupled to the processor 1102. The communication port 1112 may be adapted to be coupled to one or more peripheral devices 1114, such as a modem, a printer, a computer, a scanner, or a camera, or to a network, such as a local area network, remote area network, intranet, or the Internet, for example.

The processor 1102 may control the processor-based system 1100 by implementing software programs stored in the memory. The software programs may include an operating system, database software, drafting software, word processing software, media editing software, or media playing software, for example. The memory is operably coupled to the processor 1102 to store and facilitate execution of various programs. For example, the processor 1102 may be coupled to system memory 1116, which may include one or more of spin torque transfer magnetic random access memory (STT-MRAM), magnetic random access memory (MRAM), dynamic random access memory (DRAM), static random access memory (SRAM), racetrack memory, and other known memory types. The system memory 1116 may include volatile memory, non-volatile memory, or a combination thereof. The system memory 1116 is typically large so that it can store dynamically loaded applications and data. In some embodiments, the system memory 1116 may include semiconductor devices, such as the semiconductor device 1000 of FIG. 10, memory cells including any of the magnetic cell cores (e.g., the magnetic cell core 101 (FIG. 1), the magnetic cell core 201 (FIG. 2), the magnetic cell core 501 (FIG. 5)) discussed above, or a combination thereof.

The processor 1102 may also be coupled to non-volatile memory 1118, which is not to suggest that system memory 1116 is necessarily volatile. The non-volatile memory 1118 may include one or more of STT-MRAM, MRAM, read-only memory (ROM) such as an EPROM, resistive read-only memory (RROM), and flash memory to be used in conjunction with the system memory 1116. The size of the non-volatile memory 1118 is typically selected to be just large enough to store any necessary operating system, application programs, and fixed data. Additionally, the non-volatile memory 1118 may include a high capacity memory such as disk drive memory, such as a hybrid-drive including resistive memory or other types of non-volatile solid-state memory, for example. The non-volatile memory 1118 may include semiconductor devices, such as the semiconductor device 1000 of FIG. 10, memory cells including any of the magnetic cell cores (e.g., the magnetic cell core 101 (FIG. 1), the magnetic cell core 201 (FIG. 2), the magnetic cell core 501 (FIG. 5)) discussed above, or a combination thereof.

Accordingly, disclosed is an electronic system comprising at least one processor. The at least one processor comprises at least one magnetic memory cell. The at least one magnetic memory cell comprises a fixed region exhibiting a fixed magnetic orientation, an intermediate oxide region adjacent to the fixed region, and a free region adjacent to the intermediate oxide region. The free region exhibits a switchable magnetic orientation. Another oxide region is adjacent to the free region, and a getter material is proximate to the another oxide region. The getter material comprises a metal and oxygen. A metal oxide of the metal has a heat of formation that is less than about 10% greater than a heat of formation of an oxide of the another oxide region. A power supply is in operable communication with the at least one processor.

While the present disclosure is susceptible to various modifications and alternative forms in implementation thereof, specific embodiments have been shown by way of example in the drawings and have been described in detail herein. However, the present disclosure is not intended to be limited to the particular forms disclosed. Rather, the present disclosure encompasses all modifications, combinations, equivalents, variations, and alternatives falling within the scope of the present disclosure as defined by the following appended claims and their legal equivalents.

What is claimed is:

1. A semiconductor device, comprising:

a magnetic region comprising a magnetic material exhibiting a switchable magnetic orientation;
an intermediate oxide region on a side of the magnetic region;
another oxide region on a side of the magnetic region opposite the intermediate oxide region; and
a getter material proximate to the another oxide region;
wherein the another oxide region exhibits an electrical resistance less than about 50% of an electrical resistance of the intermediate oxide region.

2. The semiconductor device of claim 1, wherein the getter material comprises calcium, strontium, aluminum, barium, zirconium, compounds thereof, or combinations thereof.

3. The semiconductor device of claim 1, wherein the getter material comprises a metal selected from the group consisting of calcium, strontium, aluminum, barium, and zirconium embedded in a carrier material.

4. The semiconductor device of claim 1, wherein the getter material comprises oxygen diffused from the another oxide region.

5. The semiconductor device of claim 1, wherein the intermediate oxide region and the another oxide region comprise the same elements.

6. The semiconductor device of claim 5, wherein the another oxide region comprises a lower oxygen concentration than the intermediate oxide region.

7. The semiconductor device of claim 1, wherein the another oxide region comprises a higher oxygen concentration proximate the magnetic region than proximate the getter material.

8. The semiconductor device of claim 1, wherein the getter material comprises calcium or calcium carbonate.

9. An electronic system, comprising:
at least one processor coupled to system memory, the system memory comprising:
at least one semiconductor device, comprising:
a free region exhibiting a free magnetic orientation;
an intermediate oxide region adjacent to the free region;
a secondary oxide region adjacent to the free region and spaced from the intermediate oxide region by the free region, the secondary oxide region consisting of magnesium oxide; and
a getter material proximate to the secondary oxide region, the getter material consisting of oxygen and a metal selected from the group consisting of calcium, strontium, barium, and zirconium, wherein the getter material does not have a common interface with the free region.

10. The electronic device of claim 9, wherein the secondary oxide region comprises an upper oxide sub-region and a lower oxide sub-region, the getter material located between the upper oxide sub-region and the lower oxide sub-region.

11. The electronic device of claim 9, wherein the getter material substantially surrounds the secondary oxide region.

12. The electronic device of claim 9, further comprising a fixed region on a side of the intermediate oxide region opposite the secondary oxide region.

13. The electronic device of claim 12, wherein the fixed region comprises CoFeB.

14. The electronic device of claim 9, wherein the secondary oxide region directly contacts the free region and the getter material.

15. The electronic device of claim 9, wherein the getter material is closer to an underlying substrate than the secondary oxide region.

16. A semiconductor device, comprising:
a magnetic region having a switchable magnetic orientation;
another magnetic region having a fixed magnetic orientation;
an intermediate oxide region between the magnetic region and the another magnetic region;
a secondary oxide region directly contacting the magnetic region and spaced from the intermediate oxide region by the magnetic region, the secondary oxide region consisting of magnesium oxide and having a lower electrical resistance than the intermediate oxide region; and
a getter region proximate to the secondary oxide region, the getter region consisting of oxygen and a getter material selected from the group consisting of at least one of calcium, strontium, aluminum, barium, and zirconium, wherein the secondary oxide region has an electrical resistance of less than about 50% of an electrical resistance of the intermediate oxide region.

17. The semiconductor device of claim 16, wherein the intermediate oxide region comprises magnesium oxide having a higher oxygen atomic percent than the secondary oxide region.

18. The semiconductor device of claim 16, wherein the getter region consists of oxygen and calcium.

19. The semiconductor device of claim 16, wherein the getter region is internal to the secondary oxide region.

* * * * *

UNITED STATES PATENT AND TRADEMARK OFFICE
CERTIFICATE OF CORRECTION

| | |
|---|---|
| PATENT NO. | : 10,290,799 B2 |
| APPLICATION NO. | : 16/000272 |
| DATED | : May 14, 2019 |
| INVENTOR(S) | : Gurtej S. Sandhu and Witold Kula |

It is certified that error appears in the above-identified patent and that said Letters Patent is hereby corrected as shown below:

In the Specification

Column 4, Line 24, change "silicon-on-insulator ("SOT")" to --silicon-on-insulator ("SOI")--

Signed and Sealed this
Twenty-first Day of April, 2020

Andrei Iancu
*Director of the United States Patent and Trademark Office*